United States Patent
Truong et al.

(10) Patent No.: US 10,175,319 B2
(45) Date of Patent: Jan. 8, 2019

(54) MAGNETIC RESONANCE IMAGING OF NEURO-ELECTRO-MAGNETIC OSCILLATIONS

(71) Applicant: Duke University, Durham, NC (US)

(72) Inventors: Trong-Kha Truong, Durham, NC (US); Allen W. Song, Chapel Hill, NC (US)

(73) Assignee: Duke University, Durham, NC (US)

( * ) Notice: Subject to any disclaimer, the term of this patent is extended or adjusted under 35 U.S.C. 154(b) by 99 days.

(21) Appl. No.: 15/582,157

(22) Filed: Apr. 28, 2017

(65) Prior Publication Data
US 2017/0322273 A1    Nov. 9, 2017

Related U.S. Application Data

(60) Provisional application No. 62/330,964, filed on May 3, 2016.

(51) Int. Cl.
G01V 3/00       (2006.01)
G01R 33/48      (2006.01)
G01R 33/54      (2006.01)

(52) U.S. Cl.
CPC ......... G01R 33/4806 (2013.01); G01R 33/54 (2013.01)

(58) Field of Classification Search
USPC ........................................................ 324/309
See application file for complete search history.

(56) References Cited

U.S. PATENT DOCUMENTS

| 5,281,917 | A | * | 1/1994 | Santyr | G01R 33/4828 324/307 |
| 5,404,882 | A | * | 4/1995 | Santyr | G01R 33/4828 324/309 |
| 5,420,510 | A | * | 5/1995 | Fairbanks | G01R 33/446 324/300 |
| 2003/0218459 | A1 | * | 11/2003 | Reddy | G01R 33/4835 324/314 |
| 2008/0281183 | A1 | * | 11/2008 | Wald | G01R 33/48 600/410 |

(Continued)

OTHER PUBLICATIONS

Bandettini et al. "Direct detection of neuronal activity with MRI: fantasy, possibility, or reality?" *Appl. Magn. Reson.* 29, 65-88 (2005).

(Continued)

*Primary Examiner* — Rodney E Fuller
(74) *Attorney, Agent, or Firm* — Myers Bigel, P.A.

(57) ABSTRACT

In vivo methods of non-invasively imaging neuro-electro-magnetic oscillations (NEMO) are carried out by electronically transmitting a pulse sequence to a subject. The pulse sequence has a first excitation pulse, typically applied along an x-axis, followed by a spin-lock pulse applied along a different axis, typically a y-axis, and having a defined frequency, followed by a second RF excitation pulse. Then MR image signal of neuroelectric activity associated with evoked and/or spontaneous neuroelectric oscillations is obtained after the second RF excitation pulse and a neuroactivity (i.e., brain activation) map based on the obtained MR image signal is generated, the neuroactivity map having high temporal and spatial accuracy of the neuroelectric activity.

25 Claims, 10 Drawing Sheets
(2 of 10 Drawing Sheet(s) Filed in Color)

(56) References Cited

U.S. PATENT DOCUMENTS

2011/0181282 A1* 7/2011 Dannels ............ G01R 33/5617
324/309

OTHER PUBLICATIONS

Bandettini et al., "Time course EPI of human brain function during task activation" *Magn. Reson. Med.* 25, 390-397 (1992).

Bianciardi et al. "Combination of BOLD-fMRI and VEP recordings for spin-echo MRI detection of primary magnetic effects caused by neuronal currents" *Magn. Reson. Imaging.* 22, 1429-1440 (2004).

Bodurka, J. et al. "Current-induced magnetic resonance phase imaging" *J. Magn. Reson.* 137, 265-271 (1999).

Bodurka, J. et al. "Toward direct mapping of neuronal activity: MRI detection of ultraweak, transient magnetic fields changes" *Magn. Reson. Med.* 47, 1052-1058 (2002).

Chai, Y. et al. "Direct detection of optogenetically evoked oscillatory neuronal electrical activity in rats using SLOE sequence" *NeuroImage.* 125, 533-543 (2016).

Chow, L. S. et al. "Investigation of axonal magnetic fields in the human corpus callosum using visual stimulation based on MR signal modulation" *J. Magn. Reson. Imaging.* 26, 265-273 (2007).

Chu, R. et al. "Hunting for neuronal currents: absence of rapid MRI signal changes during visual-evoked response" *NeuroImage.* 23, 1059-1067 (2004).

Halpern-Manners, et al. "Magnetic resonance imaging of oscillating electrical currents" *Proc. Natl. Acad. Sci. U.S.A.* 107, 8519-8524 (2010).

Hämäläinen et al. "Magnetoencephalography—theory, instrumentation, and applications to noninvasive studies of the working human brain" *Rev. Mod. Phys.* 65, 413-497 (1993).

Hillyard et al. "Electrical signs of selective attention in the human brain" *Science*, 182, 177-180 (1973).

Jiang, X. et al. "Detection of subnanotesla oscillatory magnetic fields using MRI" *Magn. Reson. Med.* 75, 519-526 (2016).

Konn et al. "Initial attempts at directly detecting alpha wave activity in the brain using MRI" *Magn. Reson. Imaging.* 22, 1413-1427 (2004).

Kwong, et al. "Dynamic magnetic resonance imaging of human brain activity during primary sensory stimulation" *Proc. Natl. Acad. Sci. USA.* 89, 5675-5679 (1992).

Luo, Q. et al. "Detection of neuronal current MRI in human without BOLD contamination" *Magn. Reson. Med.* 66, 492-497 (2011).

Mandelkow, H. et al. "Heart beats brain: the problem of detecting alpha waves by neuronal current imaging in joint EEG-MRI experiments" *NeuroImage.* 37, 149-163 (2007).

Ogawa, S. et al. "Intrinsic signal changes accompanying sensory stimulation: functional brain mapping with magnetic resonance imaging" *Proc. Natl. Acad. Sci. USA.* 89, 5951-5955 (1992).

Park, T. S. et al. "Observation of the fast response of a magnetic resonance signal to neuronal activity: a snail ganglia study" *Physiol. Meas.* 27, 181-190 (2006).

Parkes, L. M. et al. "Inability to directly detect magnetic field changes associated with neuronal activity" *Magn. Reson. Med.* 57, 411-416 (2007).

Petridou, N. et al. "Direct magnetic resonance detection of neuronal electrical activity" *Proc. Natl. Acad. Sci. USA.* 103, 16015-16020 (2006).

Sundaram, P. et al. "Fast human brain magnetic resonance responses associated with epileptiform spikes" *Magn. Reson. Med.* 64, 1728-1738 (2010).

Tang L. et al. "Failure to direct detect magnetic field dephasing corresponding to ERP generation" *Magn. Reson. Imaging.* 26, 484-489 (2008).

Truong, T.-K. et al. "Application of k-space energy spectrum analysis for inherent and dynamic $B_0$ mapping and deblurring in spiral imaging" *Magn. Reson. Med.* 64, 1121-1127 (2010).

Witschey II, W. R. T. et al. "Artifacts in T1ρ-weighted imaging: compensation for $B_1$ and $B_0$ field imperfections" *J. Magn. Reson.* 186, 75-85 (2007).

Witzel, et al. "Stimulus-induced rotary saturation (SIRS): a potential method for the detection of neuronal currents with MRI" *NeuroImage.* 42, 1357-1365 (2008).

Xiong, J. et al. "Directly mapping magnetic field effects of neuronal activity by magnetic resonance imaging" *Hum. Brain Mapp.* 20, 41-49 (2003).

Zhu, B. et al. "Selective magnetic resonance imaging of magnetic nanoparticles by acoustically induced rotary saturation" *Magn. Reson. Med.* 75, 97-106 (2016).

\* cited by examiner

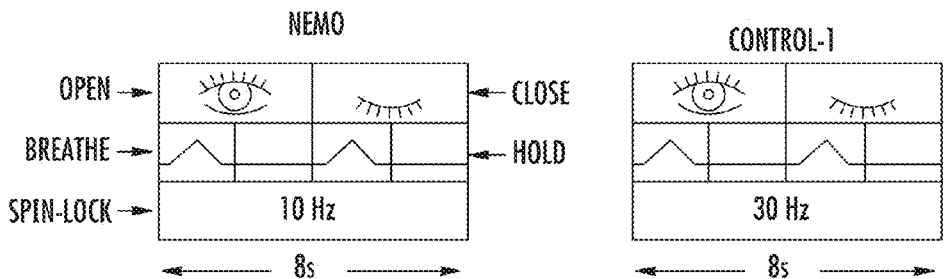
FIG. 3A  FIG. 3B
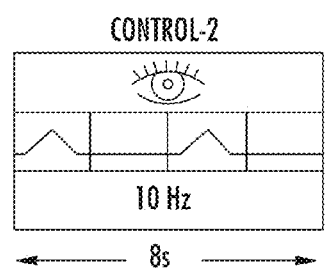  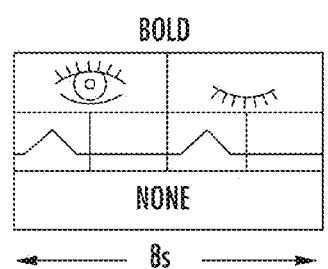
FIG. 3C  FIG. 3D
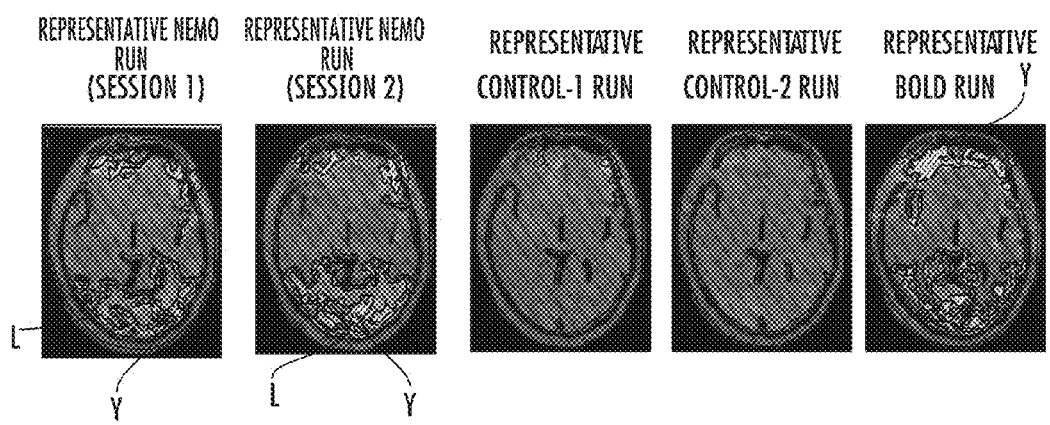
FIG. 3E  FIG. 3F  FIG. 3G  FIG. 3H  FIG. 3I

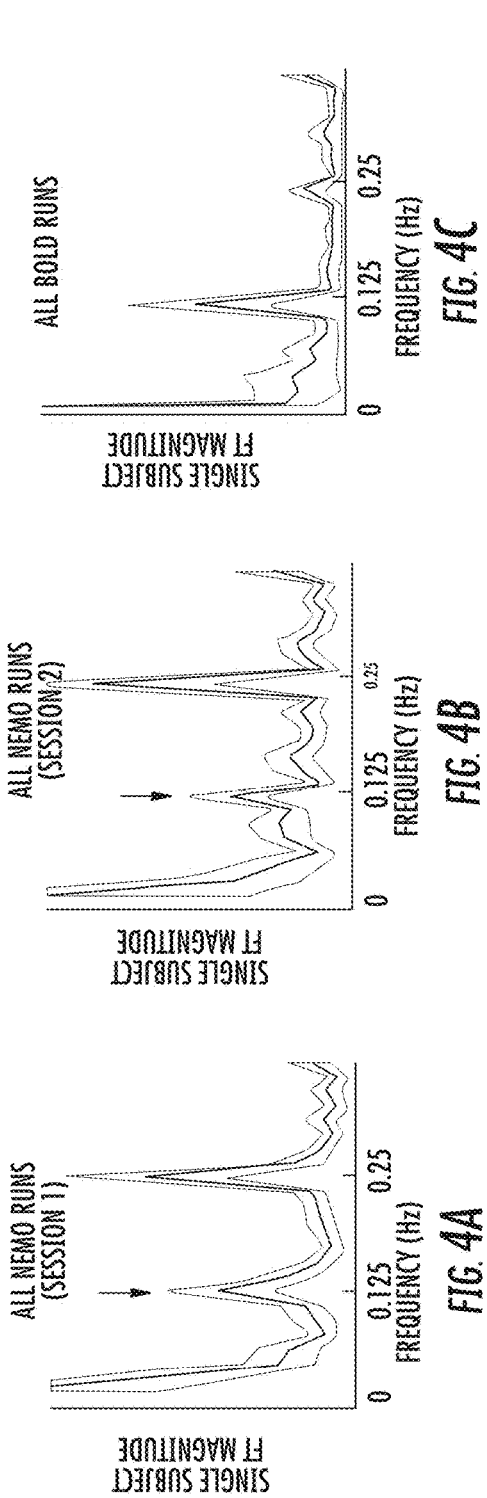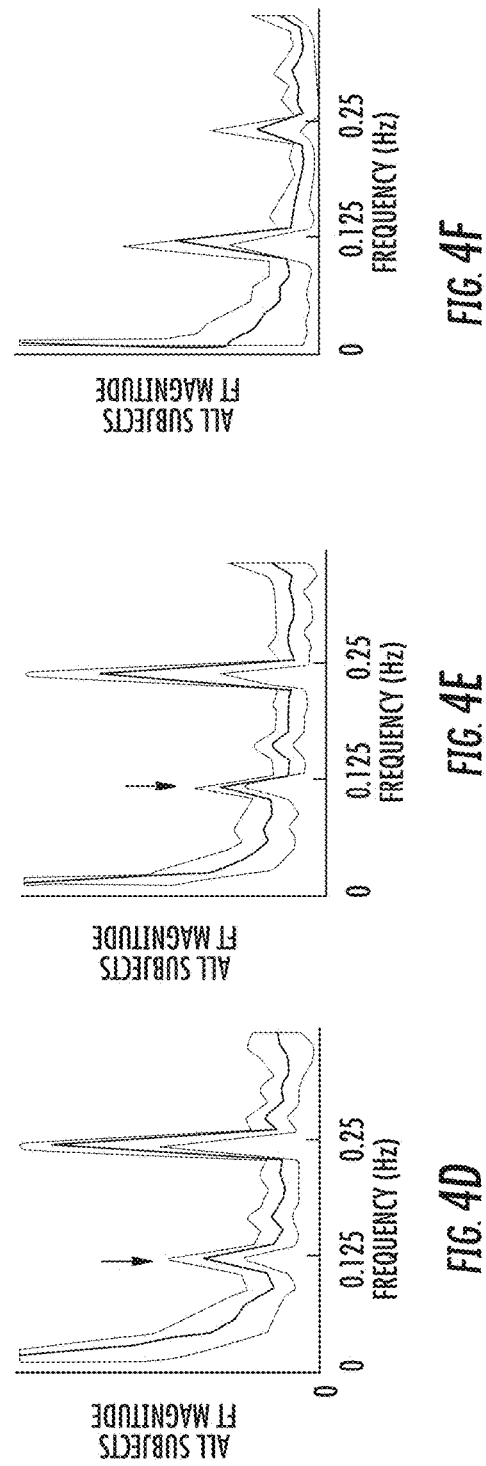

MAGNETIC RESONANCE IMAGING OF NEURO-ELECTRO-MAGNETIC OSCILLATIONS

RELATED APPLICATIONS

This application claims priority to and the benefit of U.S. Provisional Application Ser. No. 62/330,964, filed May 3, 2016, the content of which is hereby incorporated by reference as if recited in full herein.

STATEMENT OF GOVERNMENT SUPPORT

This invention was made with government support under Grant Number R24 MH106048 awarded by from the National Institutes of Health. The government has certain rights in the invention.

FIELD OF THE INVENTION

The present invention is related to Magnetic Resonance Imaging (MRI).

BACKGROUND

Neuroimaging techniques are used to investigate the function of the human brain, but it is believed that none are currently able to accurately localize neuronal activity with a suitably high spatial and temporal resolution. See, e.g., Kwong, et al., Dynamic magnetic resonance imaging of human brain activity during primary sensory stimulation. *Proc. Natl. Acad. Sci. USA.* 89, 5675-5679 (1992); Bandettini et al., Time course EPI of human brain function during task activation, *Magn. Reson. Med.* 25, 390-397 (1992); Ogawa, S. et al. Intrinsic signal changes accompanying sensory stimulation: functional brain mapping with magnetic resonance imaging. *Proc. Natl. Acad. Sci. USA.* 89, 5951-5955 (1992); Hillyard et al., Electrical signs of selective attention in the human brain. Science. 182, 177-180 (1973); and Hämäläinen et al., Magnetoencephalography—theory, instrumentation, and applications to noninvasive studies of the working human brain. *Rev. Mod. Phys.* 65, 413-497 (1993).

Noninvasive neuroimaging techniques are arguably the most widely used tools to study the structure and function of the human brain in vivo. Functional magnetic resonance imaging (fMRI) based on the blood oxygenation level-dependent (BOLD) contrast benefits from a relatively high spatial resolution and a whole-brain coverage, but it relies on hemodynamic modulations and is thus only an indirect measure of neuronal activity, and with a very low temporal resolution. Conversely, scalp-recorded electroencephalography (EEG) and magnetoencephalography (MEG), which are more direct measures of neural activity, benefit from a high temporal resolution and can capture neuronal oscillations. However, they are limited by a poor spatial resolution, primarily due to the inverse problem for localizing sources of electrical activity measured on the surface of a volume. Multi-modal imaging such as simultaneous EEG/fMRI can provide complementary information about brain activity, but cannot truly achieve a high spatial and temporal accuracy simultaneously due to the disparate signal sources.

SUMMARY OF EMBODIMENTS OF THE INVENTION

Embodiments of the invention are directed to MRI neuroimaging systems, circuits and protocols that can noninvasively image neuroelectric activity with a high spatial and temporal resolution, which may be particularly suitable for evaluating and/or studying the human brain.

Embodiments of the invention are directed to in vivo MRI protocols that can noninvasively image magnetic field oscillations resulting from neuroelectric activity, in one or more defined frequency bands.

Embodiments of the invention provide pulse sequences for MR Scanners for obtaining MRI image signals that can accurately localize neuronal activity with high spatial and temporal resolution in neuroactivation maps.

Embodiments of the invention are directed to MRI data acquisition and processing methods, circuits and systems that can directly image neuroelectric activity.

Some embodiments are directed to an image processing circuit configured to electronically carry out any of the methods described above and/or herein.

Some embodiments are directed to an MR image processing system that includes at least one processor configured to carry out any of the methods described and/or claimed herein.

Some embodiments are directed to an in vivo method of non-invasively imaging neuro-electro-magnetic oscillations (NEMO). The methods include: electronically transmitting a pulse sequence to a subject, wherein the pulse sequence comprises a first radiofrequency (RF) excitation pulse applied along a first axis followed by a spin-lock pulse applied along a second axis and having a frequency, followed by a second RF excitation pulse; then after the second RF excitation pulse, electronically obtaining MR image signal of neuroelectric activity associated with evoked and/or spontaneous neuroelectric oscillations; and electronically generating a neuroactivation map of the neuroelectric activity based on the obtained MR image signal. The electronically transmitting the pulse sequence is carried out so that the spin-lock pulse is turned OFF once a defined nutation angle θ of signal magnetization (M) is reached, then spoiler gradients are applied to dephase and eliminate Mx and My signal components before the second RF excitation pulse is transmitted and so that only Mz signal is obtained after the second RF excitation pulse for the electronically obtaining the MR image signal.

The first axis can be an x axis and the spin lock pulse can be applied along a y-axis as the second axis.

The first axis can be a y-axis and the spin lock pulse can be applied along an x-axis as the second axis.

The frequency of the spin-lock pulse can be in a range of 0.5 Hz to 1000 Hz.

The signal can depend on a phase of the neuroelectric oscillations and the frequency of the spin-lock pulse can correspond to a frequency in a brain activity frequency band of the neuroelectric oscillations.

The activation map can be a brain activation map having high temporal and spatial accuracy of the neuroelectric activity.

The obtained MR image signal can be generated only by an Mz signal component and excludes Mx and My signal components.

A sin(theta) component of the magnetization (M) can be used to generate the MR signal.

The spin-lock pulse has a duration in a range of 10 ms to 200 ms.

The subject can be human.

A readout of the electronically obtaining the MR signal can be a 2D imaging readout.

A readout of the electronically obtaining the MR signal can be a 3D imaging readout.

A readout of the electronically obtaining the MR signal can be a gradient-echo imaging readout.

A readout of the electronically obtaining the MR signal can be a spin-echo imaging readout.

A readout of the electronically obtaining the MR signal can be a spiral imaging readout.

A readout of the electronically obtaining the MR signal can be an echo-planar imaging readout.

The first RF excitation pulse can include about a 90 degree excitation pulse.

Other embodiments are directed to an image processing circuit configured to electronically carry out any of the methods described herein.

Yet other embodiments are directed to an MRI image processing system in communication with and/or at least partially on-board an MRI Scanner, comprising at least one processor configured to carry out any of the methods described herein.

Some embodiments are directed to a data processing system that includes non-transitory computer readable storage medium having computer readable program code embodied in the medium. The computer-readable program code includes computer readable program code configured to carry out any of the methods of Claims 1-17.

Still other embodiments are directed to MRI systems that include MR scanner; a circuit in communication with or at least partially onboard the MR scanner, the circuit including a neuro-electro-magnetic oscillations (NEMO) module; and a head coil in communication with the NEMO module. The circuit and/or MR scanner is configured to electronically transmit a pulse sequence to a subject, wherein the pulse sequence comprises a first radiofrequency (RF) excitation pulse applied along a first axis followed by a spin-lock pulse applied along a second different axis and having a frequency, followed by a second RF excitation pulse, and wherein the circuit obtains MR image signal of neuroelectric activity associated with evoked and/or spontaneous neuroelectric oscillations and generates a neuroactivation map based on the obtained MR image signal. The pulse sequence is carried out so that the spin-lock pulse is turned OFF once a defined nutation angle θ of signal magnetization (M) is reached, then spoiler gradients are applied to dephase and eliminate Mx and My signal components before the second RF excitation pulse is applied and so that only Mz signal is obtained as the MR image signal after the second RF excitation pulse.

The first axis can be an x axis and the spin lock pulse can be applied along a y-axis as the second axis.

The first axis can be a y-axis and the spin lock pulse can be applied along an x-axis as the second axis.

The frequency of the spin-lock pulse can be in a range of 0.5 Hz-1000 Hz.

The Mz signal can depend on a phase of the neuroelectric oscillations and the frequency of the spin-lock pulse can correspond to a frequency in a brain activity frequency band of the neuroelectric oscillations.

The neuroactivation map can be a brain activation map having high temporal and spatial accuracy of the neuroelectric activity.

Yet other embodiments are directed to a data processing system with non-transitory computer readable storage medium having computer readable program code embodied in the medium. The computer-readable program code includes computer readable program code configured to carry out any of the methods described and/or claimed herein.

It is noted that aspects of the invention described with respect to one embodiment, may be incorporated in a different embodiment although not specifically described relative thereto. That is, all embodiments and/or features of any embodiment can be combined in any way and/or combination. Further, any feature or sub-feature claimed with respect to one claim may be included in another future claim without reservation and such shall be deemed supported in the claims as filed. Thus, for example, any feature claimed with respect to a method claim can be alternatively claimed as part of a system, circuit, computer readable program code or workstation. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

The foregoing and other objects and aspects of the present invention are explained in detail herein.

BRIEF DESCRIPTION OF THE DRAWINGS

The patent or application file contains at least one drawing executed in color. Copies of this patent or patent application publication with color drawings will be provided by the Office upon request and payment of the necessary fee.

FIGS. 3A-3D are schematic illustrations of different signal acquisition protocols used to obtain the corresponding activation maps FIG. 3E-FIG. 3I according to embodiments of the present invention.

FIGS. 4A-4C are graphs of power spectra for a single subject for NEMO runs (FIGS. 4A, 4B) and BOLD runs (FIG. 4C) according to embodiments of the present invention. The arrows in the NEMO runs (FIGS. 4A, 4B) reflect the peak at 0.125 Hz due to the eyes open/closed task.

FIGS. 4D-4F are graphs of power spectra for all subjects for NEMO runs (FIGS. 4D, 4E) and BOLD runs (FIG. 4F) according to embodiments of the present invention. The arrows in the NEMO runs (FIGS. 4D, 4E) reflect the peak at 0.125 Hz due to the eyes open/closed task.

FIG. 6A (single subject) and FIG. 6C (all subjects) show NEMO runs according to embodiments of the present invention. FIG. 6B (single subject) and FIG. 6D (all subjects) show BOLD runs.

DETAILED DESCRIPTION

Figure 1A:
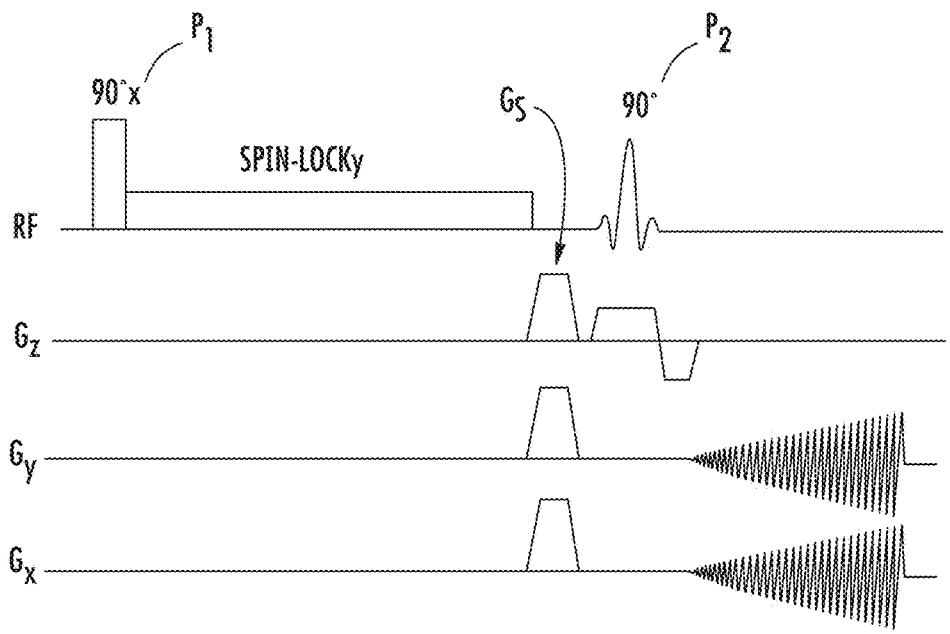
FIG. 1A is a schematic diagram of an exemplary pulse sequence according to embodiments of the present invention.
Figure 1B:
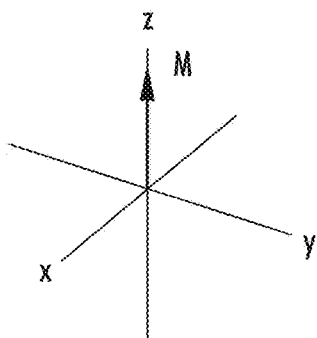
FIGS. 1B-1E are schematic illustrations of a time evolution of the magnetization based on the pulse sequence shown in FIG. 1A.

For the purposes of promoting an understanding of the principles of the present disclosure, reference will now be made to preferred embodiments and specific language will be used to describe the same. It will nevertheless be understood that no limitation of the scope of the disclosure is thereby intended, such alteration and further modifications of the disclosure as illustrated herein, being contemplated as would normally occur to one skilled in the art to which the disclosure relates.

Articles "a" and "an" are used herein to refer to one or to more than one (i.e., at least one) of the grammatical object of the article. By way of example, "an element" means at least one element and can include more than one element.

Unless otherwise defined, all technical terms used herein have the same meaning as commonly understood by one of ordinary skill in the art to which this disclosure belongs.

The present invention will now be described more fully hereinafter with reference to the accompanying figures, in which embodiments of the invention are shown. This invention may, however, be embodied in many different forms and should not be construed as limited to the embodiments set forth herein. Like numbers refer to like elements throughout. In the figures, certain layers, components or features may be exaggerated for clarity, and broken lines illustrate optional features or operations unless specified otherwise. In addition, the sequence of operations (or steps) is not limited to the order presented in the figures and/or claims unless specifically indicated otherwise. In the drawings, the thickness of lines, layers, features, components and/or regions may be exaggerated for clarity and broken lines illustrate optional features or operations, unless specified otherwise. Features described with respect to one figure or embodiment can be associated with another embodiment of figure although not specifically described or shown as such. The terms "FIG." and "Fig." are used interchangeably with the word "Figure" in the specification and drawings.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items.

It will be understood that although the terms "first" and "second" are used herein to describe various actions, steps or components and should not be limited by these terms. These terms are only used to distinguish one action, step or component from another action, step or component. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

Embodiments of the invention provide neuroimaging protocols that can directly and non-invasively image neuroelectric activity with both a high spatial and temporal resolution and/or accuracy.

The term "high spatial resolution" means that the MRI data are acquired with a small voxel size, typically on the order of a few millimeters (i.e., 5 mm or less). The term "high spatial accuracy" means that the spatial location of the brain activation detected from the MRI data accurately reflects the spatial location of the underlying neuroelectric activity. The term "high temporal accuracy" means that the timing of the brain activation detected from the MRI data accurately reflects the timing of the underlying neuroelectric activity.

The term "protocol" refers to an automated electronic algorithm and/or computer program(s) with defined rules for a pulse sequence, image data acquisition and reconstruction. The NEMO protocol can directly image neuroelectric activity associated with spontaneous and/or evoked neuroelectric oscillations with both a high spatial and temporal accuracy. Typical neuroelectric oscillations generate magnetic fields in a range of between 1 nT and 0.1 nT in a respective voxel. See, e.g., Romani, G. L. in *Advances in Biomagnetics* (ed. Wiliamson, S.) 33-46 (Plenum Press, New York, 1989); and Wikswo, J. P. in *Advances in Biomagnetics* (ed. Wiliamson, S.) 1-19 (Plenum Press, New York, 1989), the contents of which are hereby incorporated by reference as if recited in full herein.

The term "spin-lock" with respect to a radiofrequency pulse refers to a pulse with a defined frequency and/or frequency band f that locks the magnetization M along an axis to which it is applied and allows the magnetization M to rotate around/about the "locked" axis at the frequency f which, in the presence of an oscillating magnetic field at the same frequency f, allows the magnetization M to nutate from a single axis into different magnetization components for different reference axes (spherical or Cartesian, for example), i.e., Mx, My, Mz components, typically using a rotary saturation effect. The spin-lock pulse can have a defined frequency/frequency band for different respective evoked and/or spontaneous neuroelectric oscillations. The spin-lock pulse can have a constant "ON" duration that terminates just prior to applications of spoiler gradients. See, also., Witzel, et al., Stimulus-induced rotary saturation (SIRS): a potential method for the detection of neuronal currents with MRI. *NeuroImage.* 42, 1357-1365 (2008); Halpern-Manners, et al., Magnetic resonance imaging of oscillating electrical currents. *Proc. Natl. Acad. Sci. U.S.A.* 107, 8519-8524 (2010); Zhu, B. et al. Selective magnetic resonance imaging of magnetic nanoparticles by acoustically induced rotary saturation. *Magn. Reson. Med.* 75, 97-106 (2016); and Jiang, X. et al. Detection of subnanotesla oscillatory magnetic fields using MRI. *Magn. Reson. Med.* 75, 519-526 (2016). The contents of these documents are hereby incorporated by reference as if recited in full herein.

As is well known to those of skill in the art, the term "spoiler gradients" refers to magnetic field gradient pulses that can dephase the magnetization about a respective gradient axis.

The term "about" means that the stated number can vary +/−to a certain degree, typically +/−10% or less.

The term "circuit" refers to an entirely software embodiment or an embodiment combining software and hardware aspects, features and/or components (including, for example, a processor and software associated therewith embedded therein and/or executable by, for programmatically directing and/or performing certain described actions, operations or method steps).

The term "programmatically" means that the operation or step can be directed and/or carried out by a digital signal processor and/or computer program code. Similarly, the term "electronically" means that the step or operation can be carried out in an automated manner using electronic components rather than manually or using any mental steps.

The terms "MRI scanner" and MR scanner" are used interchangeably to refer to a Magnetic Resonance Imaging system and includes the high-field magnet and the operating components, e.g., the RF amplifier, gradient amplifiers and processors that typically direct the pulse sequences and select the scan planes. Examples of current commercial MR scanners include: GE Healthcare: Signa 1.5T/3.0T; Philips Medical Systems: Achieva 1.5T/3.0T; Integra 1.5T; Siemens: MAGNETOM Avanto; MAGNETOM Espree; MAGNETOM Symphony; MAGNETOM Trio; and MAGNETOM Verio. As is well known, the MR scanner can include a main operating/control system that is housed in one or more cabinets that reside in an MR control room while the MRI magnet resides in the MR scan suite. The control room and scan room can be referred to as an MR suite and the two rooms can be separated by an RF shield wall. The term "high-magnetic field" refers to field strengths above 0.5 T, typically above 1.0T, and more typically between about 1.5T and 10T. Embodiments of the invention may be particularly suitable for 1.5T and 3.0T systems, or higher field systems such as future contemplated systems at 4.0T, 5.0T, 6.0T, 7T, 8T, 9T and the like. Other embodiments may be more suitable for low-field magnet scanner systems such as 0.1T to about 0.5T.

The methods and systems can also be applied to animal MRI data acquired from animal MRI scanners but may be particularly suitable for human patients.

The term "patient" refers to humans and animals.

The term "automatically" means that the operation can be substantially, and typically entirely, carried out without manual input, and is typically programmatically directed and/or carried out. The term "electronically" with respect to connections includes both wireless and wired connections between components.

The term "clinician" means physician, radiologist, physicist, or other medical personnel desiring to review medical data of a patient. The term "workstation" refers to a display and/or computer associated with an MR scanner and can be remote from the MR scanner for access by a clinician.

The term "reconstruction" is used broadly to refer to original image data acquisition and subsequent construction of MRI image slices or MRI images of an image data set.

Embodiments of the present invention may take the form of an entirely software embodiment or an embodiment combining software and hardware aspects, all generally referred to herein as a "circuit" or "module." Furthermore, the present invention may take the form of a computer program product on a computer-usable storage medium having computer-usable program code embodied in the medium. Any suitable computer readable medium may be utilized including hard disks, CD-ROMs, optical storage devices, a transmission media such as those supporting the Internet or an intranet, or magnetic storage devices. Some circuits, modules or routines may be written in assembly language or even micro-code to enhance performance and/or memory usage. It will be further appreciated that the functionality of any or all of the program modules may also be implemented using discrete hardware components, one or more application specific integrated circuits (ASICs), or a programmed digital signal processor or microcontroller. Embodiments of the present invention are not limited to a particular programming language.

Computer program code for carrying out operations of the present invention may be written in an object oriented programming language such as Java®, Smalltalk or C++. However, the computer program code for carrying out operations of the present invention may also be written in conventional procedural programming languages, such as the "C" programming language. The program code may execute entirely on the user's computer, partly on the user's computer, as a stand-alone software package, partly on the user's computer and partly on another computer, local and/or remote or entirely on the other local or remote computer. In the latter scenario, the other local or remote computer may be connected to the user's computer through a local area network (LAN) or a wide area network (WAN), or the connection may be made to an external computer (for example, through the Internet using an Internet Service Provider). Embodiments of the invention may be carried out using a cloud computing service (or an aggregation of multiple cloud resources), which may be generally referred to as the "Cloud". Cloud storage may include a model of networked computer data storage where data is stored on multiple virtual servers, rather than being hosted on one or more dedicated servers. Firewalls and suitable security protocols can be followed to exchange and/or analyze patient data.

Embodiments of the present invention are described herein, in part, with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a digital signal processor and/or non-transitory computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing some or all of the functions/acts specified in the flowchart and/or block diagram block or blocks.

The flowcharts and block diagrams of certain of the figures herein illustrate exemplary architecture, functionality, and operation of possible implementations of embodiments of the present invention. In this regard, each block in the flow charts or block diagrams represents a module, segment, or portion of code, which comprises one or more executable instructions for implementing the specified logical function(s). It should also be noted that in some alternative implementations, the functions noted in the blocks may occur out of the order noted in the figures. For example, two blocks shown in succession may in fact be executed substantially concurrently or the blocks may sometimes be executed in the reverse order or two or more blocks may be combined, or a block divided and performed separately, depending upon the functionality involved.

Generally stated, embodiments of the present invention can noninvasively and directly image neuroelectric activity in the human brain and/or peripheral nervous system in vivo with high specificity both spatially and temporally, in contrast to existing neuroimaging techniques. Accordingly, it is contemplated that use of the new technology may be transformative in advancing noninvasive study of both the functions and dysfunctions of the human brain. The new technology may also benefit drug discovery, clinical trials of therapeutics and the like.

Early attempts at using MRI to detect a phase shift or signal loss caused by electrical currents were successful in phantom, See, e.g., Bodurka, J. et al. Current-induced magnetic resonance phase imaging. *J. Magn. Reson.* 137, 265-271 (1999), and in vitro studies, See also, Bodurka, J. & Bandettini, P. A. Toward direct mapping of neuronal activity: MRI detection of ultraweak, transient magnetic fields changes. *Magn. Reson. Med.* 47, 1052-1058 (2002); and Petridou, N. et al. Direct magnetic resonance detection of neuronal electrical activity. *Proc. Natl. Acad. Sci. USA.* 103, 16015-16020 (2006). Park, T. S., Lee, S. Y., Park, J. -H., Cho, M. H. & Lee, S. Y. Observation of the fast response of a magnetic resonance signal to neuronal activity: a snail ganglia study. *Physiol. Meas.* 27, 181-190 (2006) However, in vivo studies have remained challenging and controversial, See, e.g., Bandettini, P. A., Petridou, N. & Bodurka, J. Direct detection of neuronal activity with MRI: fantasy, possibility, or reality? *Appl. Magn. Reson.* 29, 65-88 (2005); Xiong, J., Fox, P. T. & Gao, J. H. Directly mapping magnetic field effects of neuronal activity by magnetic resonance imaging. *Hum. Brain Mapp.* 20, 41-49 (2003); Bianciardi, M., Di Russo, F., Aprile, T., Maraviglia, B. & Hagberg, G. E. Combination of BOLD-fMRI and VEP recordings for spin-echo MRI detection of primary magnetic effects caused by neuronal currents. *Magn. Reson. Imaging.* 22, 1429-1440 (2004); Konn, D., Leach, S., Gowland, P. & Bowtell, R. Initial attempts at directly detecting alpha wave activity in the brain using MRI. *Magn. Reson. Imaging.* 22, 1413-1427 (2004); Chow, L. S., Cook, G. G., Whitby, E. & Paley, M. N. J. Investigation of axonal magnetic fields in the human corpus callosum using visual stimulation based on MR signal modulation. *J. Magn. Reson. Imaging.* 26, 265-273 (2007); Chu, R. et al. Hunting for neuronal currents: absence of rapid MM signal changes during visual-evoked response. *NeuroImage.* 23, 1059-1067 (2004); Parkes, L. M., de Lange, F. P., Fries, P., Toni, I. & Norris, D. G. Inability to directly detect magnetic field changes associated with neuronal activity. *Magn. Reson. Med.* 57, 411-416 (2007); Mandelkow, H. et al. Heart beats brain: the problem of detecting alpha waves by neuronal current imaging in joint EEG-MRI experiments. *NeuroImage.* 37, 149-163 (2007); Tang, L., Avison, M. J., Gatenby, J. C. & Gore, J. C., Failure to direct detect magnetic field dephasing corresponding to ERP generation. *Magn. Reson. Imaging.* 26, 484-489 (2008); and Sundaram, P. et al. Fast human brain magnetic resonance responses associated with epileptiform spikes. *Magn. Reson. Med.* 64, 1728-1738 (2010), because the magnetic fields induced by neuronal currents are not only extremely weak, but can also be oscillatory, resulting in temporal cancellation within the acquisition window.

FIG. 1A illustrates a pulse sequence that can reach an unprecedented sensitivity to image neuro-electro-magnetic oscillations (NEMO) in the human brain in vivo. FIGS. 1B-1E illustrate a time evolution of a magnetization M caused by the pulse sequence shown in FIG. 1A for obtaining MR image data of neuroactivity.

Figure 1C:
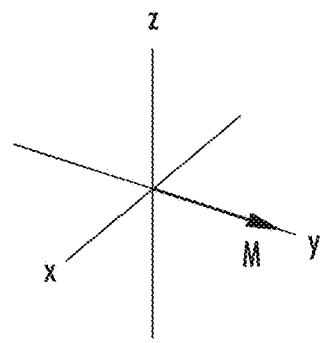
Figure 1D:
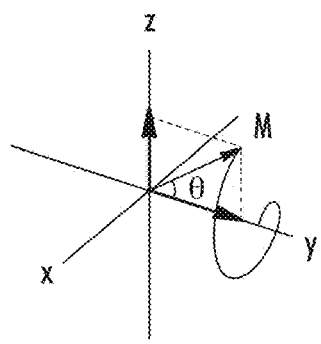
Figure 1E:
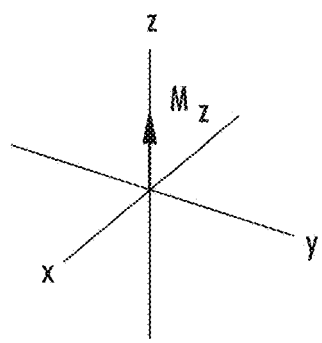

The pulse sequence has a spin-lock preparation that can be followed by a gradient-echo single-shot spiral readout (FIG. 1A). In some embodiments, a radiofrequency pulse ($P_1$), which can have about a 90 degree flip angle) is first applied along the x-axis (in the rotating frame), which flips the magnetization M from the z-axis (FIG. 1B) to the y-axis (FIG. 1C). A spin-lock pulse with a frequency f is then applied along the y-axis, so that M is temporarily locked along this axis and rotates around it at the same frequency. In the presence of neuroelectric oscillations at the same or substantially the same frequency f, which generate an oscillating magnetic field along the z-axis, M gradually nutates away from the y-axis due to gyromagnetic forces (FIG. 1D). The term "substantially the same frequency" when referring to the spin-lock pulse means a frequency that is typically within a range of 10 Hz around the spin-lock frequency. Once a sufficient nutation angle θ is reached, typically at least 1 degree, the spin-lock pulse is turned off and strong (typically at or greater than 10 mT/m) magnetic field spoiler gradients Gs are applied to dephase and eliminate the $M_x$ and $M_y$ components, while preserving the $M_z$ component (FIG. 1E), which is subsequently excited by another radiofrequency (RF) pulse $P_2$ where MR signal can be obtained to generate an MR image of NEMO.

As is well known to those of skill in the art, the pulse sequence comprises different components such as RF (radiofrequency) and gradient pulses. The pulse sequence is typically transmitted to the scanner but may be onboard the scanner. The RF pulses are transmitted to the body coil for excitation and the gradient pulses to the gradient coils for spatial encoding. The head coil is not required for transmitting the pulses, but can be used for only reception/receiving the MR signal according to embodiments of the present invention.

It is also noted that, for example, the first RF pulse can also or alternatively be applied along the y axis and the spin-lock pulse along the x axis.

The pulse sequence can have a first portion that can be used to sensitize the MRI signal to neuronal oscillations in a given frequency band and which includes a first RF pulse (which would typically be a 90-degree pulse, but could technically also be at a different flip angle), the spin-lock pulse, and the spoiler gradients (which can be applied on the x, y, and/or z axes). The pulse sequence has a second part that is used to generate an MRI image and includes the second RF pulse (which is does not have to be a 90-degree pulse) and a readout. In the examples shown, a 2D gradient-echo spiral imaging readout was used, but other readouts may be used, for example, a 3D readout instead of a 2D readout, a spin-echo instead of a gradient-echo sequence, or an echo-planar imaging (or any other type of readout) instead of a spiral imaging readout, which can involve different or additional RF pulses and/or gradients as is well known by those of skill in the art.

It is contemplated that the only obtained image signal is the Mz component of the magnetization due to the neuroelectric oscillations whereas the Mx and My components as well as other contributions to the magnetization can be eliminated by the spoiler gradients.

One advantage of the NEMO technique/protocol is the boost in signal-to-noise ratio resulting from the fact that only the $M_z$ component, which is due to the neuroelectric oscillations, is imaged, whereas the $M_x$ and $M_y$ components as well as other contributions to the magnetization (e.g., due to $B_0$ inhomogeneities) remain in the transverse plane and are eliminated by the strong spoiler gradients Gs (at least Gy, Gx gradients applied concurrently or Gx, Gy, Gz gradients applied concurrently) applied before the second RF pulse $P_2$ shown in FIG. 1A), thereby effectively suppressing the noise floor. In contrast, previous spin-lock techniques may be confounded by such additional contributions, since they either apply a second 90° pulse after the spin-lock pulse to restore all of the transverse magnetization to the z-axis for subsequent excitation (see, Zhu, B. et al. Selective magnetic resonance imaging of magnetic nanoparticles by acoustically induced rotary saturation. *Magn. Reson. Med.* 75, 97-106 (2016)) or leave it in the transverse plane for subsequent imaging. See also, e.g., Jiang, X. et al. Detection of subnanotesla oscillatory magnetic fields using MRI. *Magn. Reson. Med.* 75, 519-526 (2016); and Chai, Y. et al. Direct detection of optogenetically evoked oscillatory neuronal electrical activity in rats using SLOE sequence. NeuroImage. 125, 533-543 (2016).

Furthermore, the NEMO protocol/technique, typically uses the sin(θ) component of M to generate the MR signal (FIG. 1D) and thus benefits from a higher sensitivity than the original spin-lock technique, See, e.g., Witzel, T., Lin, F. -H., Rosen, B. R. & Wald, L. L. Stimulus-induced rotary saturation (SIRS): a potential method for the detection of neuronal currents with MRI. *NeuroImage*. 42, 1357-1365 (2008); and Halpern-Manners, N. W., Bajaj, V. S., Teisseyre, T. Z. & Pines, A. Magnetic resonance imaging of oscillating electrical currents. *Proc. Natl. Acad. Sci. U.S.A.* 107, 8519-8524 (2010), which used the (1−cos(θ)) component, since sin(θ)>>1−cos(θ) for small θ values, See, e.g., Zhu, B. et al. Selective magnetic resonance imaging of magnetic nanoparticles by acoustically induced rotary saturation. *Magn. Reson. Med.* 75, 97-106 (2016); and Jiang, X. et al. Detection of subnanotesla oscillatory magnetic fields using MRI. *Magn. Reson. Med.* 75, 519-526 (2016).

Figure 2A:
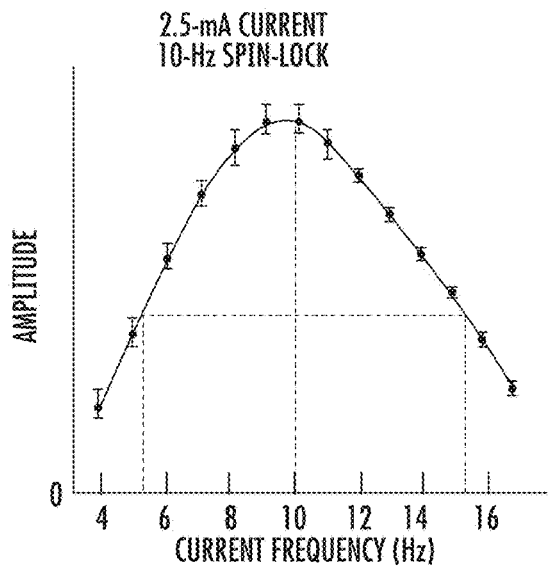
FIG. 2A is a graph of amplitude (sinusoid) versus current frequency (Hz) for a phantom experiment using a 2.5 mA, 10 Hz spin lock with a peak centered on the spin lock frequency according to embodiments of the present invention.
Figure 2B:
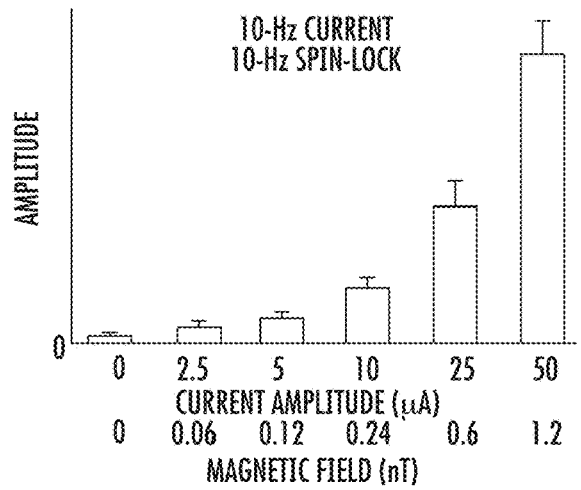
FIG. 2B is a graph of amplitude versus current amplitude (μA) and magnetic field (nT) illustrating a 0.06 nT magnetic field is detectable with 15 time points (P=0.0002), which corresponds to 0.01 nT when using 512 time points according to embodiments of the present invention.
Figure 2C:
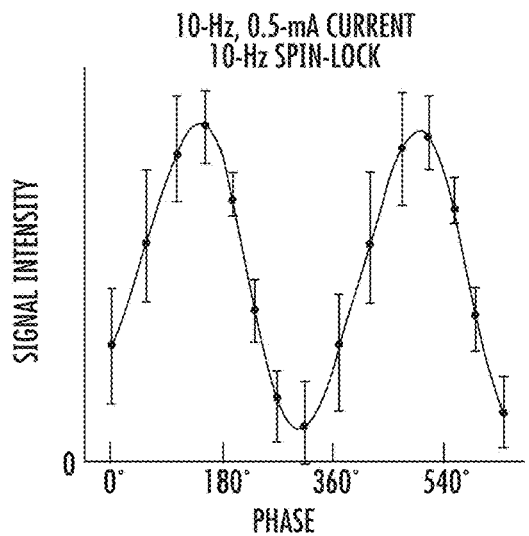
FIG. 2C is a graph of signal intensity (means +/−standard deviation) versus phase of the oscillating current relative to the spin-lock, fit with a sinusoid according to embodiments of the present invention.

The obtained Mz signal depends on the phase of the neuroelectric oscillations relative to the spin-lock pulse. For example, in the particular cases where M ends up in the x-y plane or in the y-z plane at the end of the spin-lock pulse, the signal would be minimal or maximal, respectively (FIG. 2C). This phase dependence can be used to investigate the temporal dynamics of the neuroelectric oscillations. For example, if the absolute or relative phase of the neuroelectric oscillations with respect to the spin-lock pulse is known, this information can be used to predict the behavior of the MR signal. Conversely, the behavior of the MR signal can provide information on the phase or timing of the neuroelectric oscillations.

It is contemplated that the frequency f of the spin-lock pulse will be within the frequency/frequency band of the target neuroelectric oscillations of brain wave activity and may also be useful outside the brain such as for the peripheral nervous system. That is, while embodiments of the invention have been described herein with respect to alpha activity, it is contemplated that the protocol can be configured to image other neuroactivity with the corresponding frequency/frequency band, i.e., Beta, Alpha, Theta, Delta and Gamma frequency bands. Each activity has a frequency band in (Hz) and has its own set of characteristics representing a specific level of brain activity and a unique state of consciousness. Phantom experiments were performed to show that the protocol/technique can detect magnetic field oscillations in a given frequency band (FIG. 2A) with a magnitude of 0.06 nT when using 15 time points (or 0.01 nT when using 512 time points, as in the human experiments below; FIG. 2B), which represents a substantial improvement over previous phantom studies. FIG. 2C is a graph of signal intensity (mean +/−standard deviation, arbitrary units) versus phase of the oscillating current relative to the spin lock, fit with a sinusoid. It is expected that the NEMO imaging protocol can image both spontaneous and evoked neuroelectric oscillations, which generate magnetic fields on the order of 1 and 0.1 nT, respectively, in a typical voxel, See, e.g., Romani, G. L. in *Advances in Biomagnetics* (ed. Wiliamson, S.) 33-46 (Plenum Press, New York, 1989); and Wikswo, J. P. in Advances in Biomagnetics (ed. Wiliamson, S.) 1-19 (Plenum Press, New York, 1989).

Figure 3J:
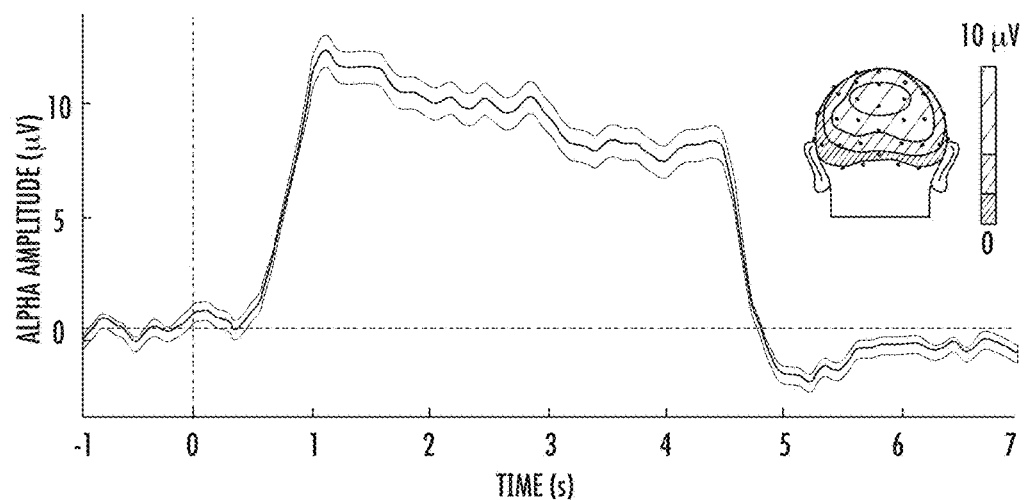
FIG. 3J is a topographic plot of alpha-band magnitude over the parietal/occipital scalp, averaged over a 1000-4500 ms time window after the cue to close the eyes over all trials inset into an associated graph of a time course of alpha amplitude (μV) (mean +/−s.e.m.) versus time from EEG measurements from a set of four electrodes (placement circled in the topographic plot) of alpha activity change with eyes closing versus opening averaged over all trials.

Four healthy volunteers were studied in repeated sessions to demonstrate the ability of the protocol/technique to image functional modulations of neuroelectric oscillations in the alpha-band (8-12 Hz). The subjects were instructed to open or close their eyes every 4 s, which is known to strongly modulate alpha activity. EEG experiments performed with the same paradigm confirmed that alpha power over visual cortex rapidly increased or decreased ~700 ms after the cue to close or open the eyes (FIG. 3J). A 500-ms repetition time for the MRI experiments was selected to capture this change. Other repetition times may be appropriate. Since spin-lock techniques are sensitive to spatiotemporal variations of the static magnetic field $B_0$, including those, induced in the brain by breathing (due to chest wall motion), the subjects were trained for this study to alternatively breathe in and out within 2 s and hold their breath for 2 s to ensure that signal changes due to such fluctuations would occur at a higher frequency (0.25 Hz and harmonics) than the 0.125-Hz eyes open/closed task frequency.

For each subject, eight runs were acquired with this paradigm, using a 10-Hz spin-lock centered on the selected alpha-band (FIG. 3A). Eight additional runs were acquired in a second session to assess the test-retest reliability. Representative activation maps, which were unthresholded to illustrate the full range of activity at the task frequency, consistently showed significant activations in the visual cortex (FIGS. 3E, 3F). While the overall extent of these NEMO activations (green lines-L) remained similar, the precise areas with the largest activation (yellow pixels-Y) varied across runs, reflecting dynamic changes in the alpha activity, as discussed below. (The frontal activation, which resulted from artifacts from the opening/closing of the eyes, was excluded from subsequent analyses.)

FIGS. 3A-3D illustrate different experimental conditions while FIGS. 3E-3H illustrate aligned, corresponding activation maps from those respective experiments. FIG. 3A, illustrates NEMO runs using a 10-Hz spin-lock to detect neuroelectric oscillations in the alpha-band (8-12 Hz), a 0.125-Hz eyes open/closed paradigm to modulate alpha activity, and a 0.25-Hz controlled breathing to minimize physiological noise. FIGS. 3B-3C show control runs using a 30-Hz spin-lock or eyes open continuously. FIG. 3D shows BOLD runs using no spin-lock and a longer echo time. Magnitude of the Fourier transform (FT) at 0.125 Hz (arbitrary units) showing significant activations in visual cortex for the NEMO runs (FIG. 3E, FIG. 3F), but not the control runs (FIGS. 3G, 3H), and a spatially distinct activation for the BOLD run (FIG. 3I).

In contrast to these activations, eight control runs acquired with the same eyes open/closed paradigm, but using a 30-Hz spin-lock (control-1, FIG. 3B), showed no activation in the visual cortex (FIG. 3G), consistent with there being no overlap between the alpha-band and the frequency range to which this spin-lock frequency is sensitive. Eight additional control runs acquired using the same 10-Hz spin-lock as for the NEMO runs, but while the subjects kept their eyes open continuously (control-2, FIG. 3C), also showed no activation (FIG. 3H), consistent with there being no modulation of alpha activity in this condition.

Finally, four BOLD runs acquired with the eyes open/closed paradigm, but with no spin-lock and with a 30-ms instead of 3-ms echo time (FIG. 3D), showed that the NEMO (FIGS. 3E, 3F) and BOLD (FIG. 3I) activations were spatially distinct. The BOLD activation was localized mainly to the interhemispheric fissure and cortical surface, consistent with its sensitivity to draining veins, whereas the NEMO activation was more widespread throughout the visual cortex.

The power spectra in the activated pixels within the visual cortex (FIGS. 4A-4C) all show a clear 0.125-Hz peak, confirming that the activation was specific to the eyes open/closed task. Consistent results were observed across all sessions and subjects (FIGS. 4D-4F). Statistical analyses showed that, for each of the two sessions and each of the four subjects, the power at 0.125 Hz across all pixels in the occipital cortex was significantly higher for the NEMO runs than for the control-1 or control-2 runs (all P-values ≤0.003). Additional analyses performed across all subjects showed that the power at 0.125 Hz averaged in all pixels in the occipital cortex was also significantly higher for the NEMO runs from both sessions than for the control-1 (P =0.015) or control-2 (P =0.017) runs.

FIGS. 4A-4D show magnitude of the FT in the activated pixels within the visual cortex (mean±s.d., arbitrary units) for the average of all NEMO runs (FIGS. 4A, 4B) and all BOLD runs (FIG. 4C) from the subject shown in FIGS. 3E-3I, and for the average of all NEMO runs (FIGS. 4D, 4E) and all BOLD runs (FIG. 4F) from the four subjects. All plots show a 0.125-Hz peak due to the eyes open/closed task (arrows) and a 0.25-Hz peak due to the controlled breathing.

While the demonstrated ability to directly image changes in the power of neuroelectric oscillations (here, in the alpha-band) is already of great significance, it may also of interest to be able to capture the dynamic phase characteristics of such oscillations. The new NEMO protocol/technique is sensitive to the phase of the neuroelectric oscillations, as reflected by the sinusoidal response observed when the phase of an oscillating current was varied relative to the spin-lock pulse in a phantom (FIG. 2C). In the human experiments, multiple short (1-min) runs were acquired, under the expectation that the phase of the spontaneous alpha-band oscillations relative to the spin-lock pulse would be naturally varying (in contrast to the phase consistency that could be achieved with driven oscillations).

Figure 5A:
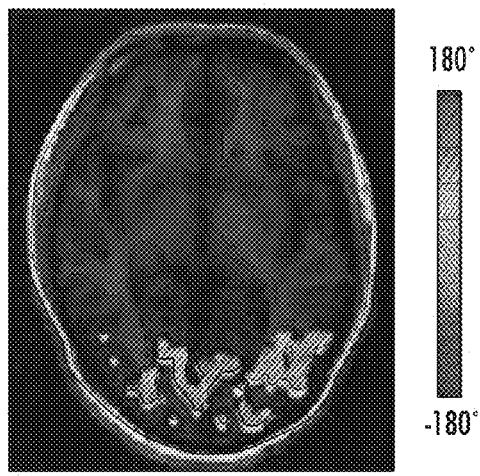
FIGS. 5A-5D are brain activation maps comparing NEMO derived brain activation maps (FIGS. 5A, 5B) and BOLD activation maps (FIGS. 5C, 5D) according to embodiments of the present invention.
Figure 5B:
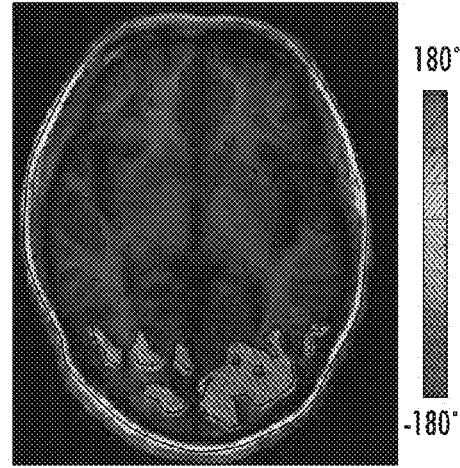
Figure 5C:
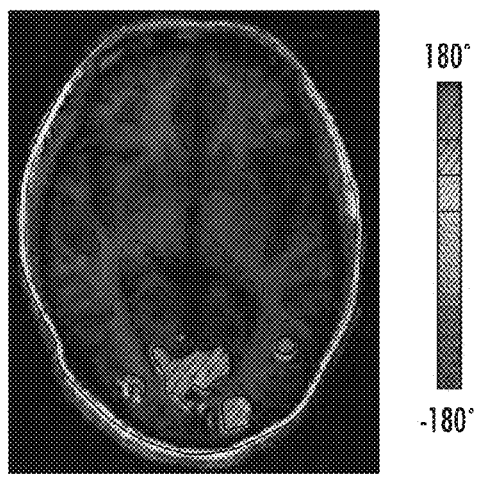
Figure 5D:
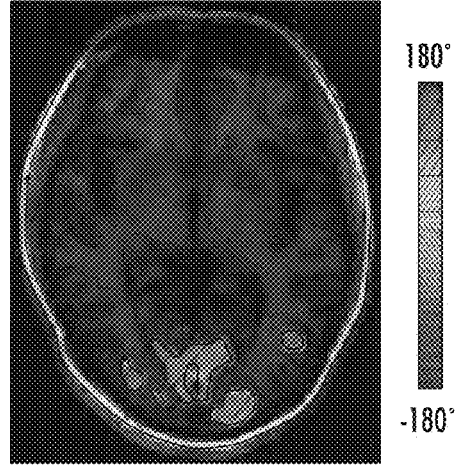
Figures 6A, 6B:
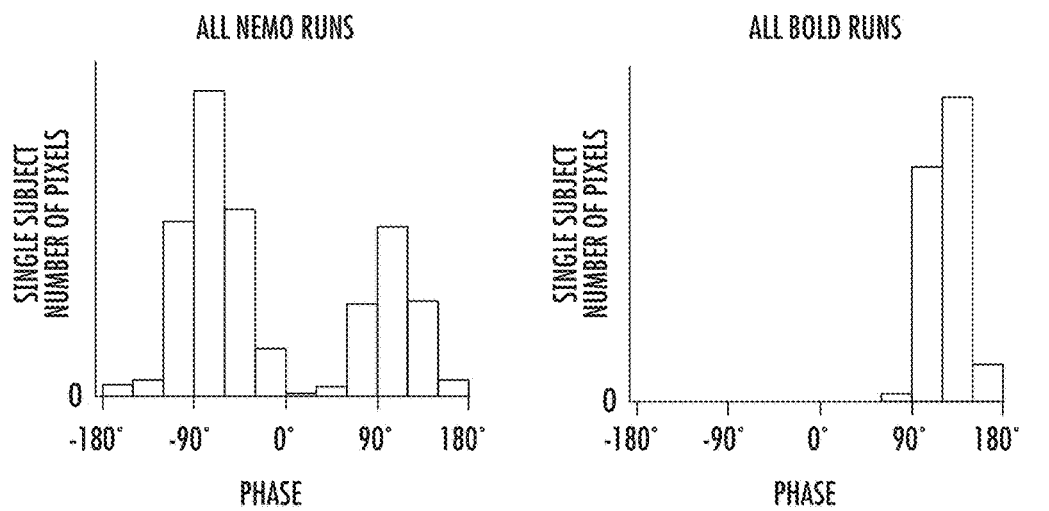
FIGS. 6A-6D are phase histograms of number of pixels versus phase.
Figures 6C, 6D:
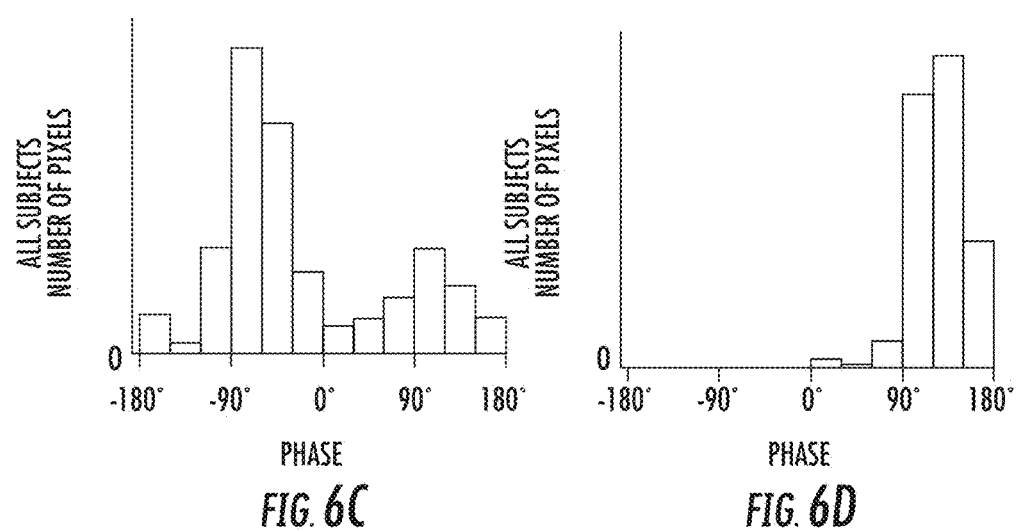

The phase of the NEMO activation varied across runs, as illustrated by representative maps of the phase of the FT at 0.125 Hz (FIGS. 5A, 5B) and by phase histograms across all runs, revealing two different pools (FIGS. 6A, 6C). Such a bimodal distribution is consistent with the sinusoidal response observed in the phantom in the absence of hemodynamic effects (FIG. 2C), since, depending on the phase of the alpha activity in a given voxel relative to the spin-lock pulse, the fast NEMO signal can either increase or decrease, resulting in either a positive or negative phase. In contrast, the phase of the slow BOLD activation was distinctly different, remained constant over time (FIGS. 5C, 5D), and exhibited a unimodal distribution (FIGS. 6B, 6D) reflecting the typical hemodynamic delays. Thus, these results show that the NEMO protocol/technique can capture the transient temporal dynamics of the magnitude and phase of NEMO activations, both of which are important components of task-induced changes in neuronal oscillations.

FIGS. 5A-5D illustrate phase of the NEMO and BOLD activations. Phase of the FT at 0.125 Hz in the activated pixels within the visual cortex for the two representative NEMO runs shown in FIGS. 3E, 3F, one of which has a positive phase and the other one a negative phase (FIGS. 5A, 5B), and for two representative BOLD runs (FIGS. 5C, 5D), one of which is shown in FIG. 3I. These maps show that the phase of the NEMO activation varied over time across different runs, whereas the phase of the BOLD activation remained constant.

FIGS. 6A-6D are phase histograms. Histograms of the phase of the FT at 0.125 Hz in the activated pixels within the visual cortex averaged across all NEMO runs (FIG. 6A) and all BOLD runs (FIG. 6B) from the subject shown in FIG. 5, and averaged across all NEMO runs (FIG. 6C) and all BOLD runs (FIG. 6D) from the four subjects. These histograms show two distinct pools for the NEMO activation and one pool for the BOLD activation.

Figure 7:
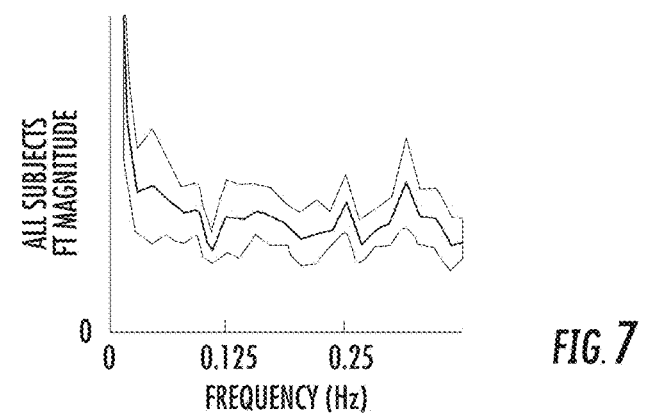
FIG. 7 is a graph of magnitude of Fourier Transform (FT) versus frequency (Hz) of the dynamic $B_0$ time courses in activated pixels of the NEMO runs (mean +/−standard deviation, arbitrary units) averaged across four human subjects, showing no significant peak at the eyes open/closed task frequency of 0.125 Hz.

The results of this study demonstrate that the NEMO protocol/technique can image magnetic field oscillations resulting from neuroelectric activity in specifiable frequency bands (here, the alpha-band) across multiple sessions and subjects. The control experiments showed that there was no such activation when the spin-lock frequency was outside the alpha-band (control-1) or when there was no modulation of alpha activity because the eyes were kept open (control-2). The control-2 runs, which used the same 10-Hz spin-lock as the NEMO runs, further ruled out any sensitivity to $B_0/B_1$ inhomogeneities, which are not synchronized with the eyes open/closed task. A comparison with conventional BOLD fMRI showed that the NEMO and BOLD activations were spatially and temporally distinct, confirming their different origins. Finally, care was taken in the experimental design and data analysis to remove the impact of breathing (FIG. 7). Altogether, these results suggest that the NEMO activation predominantly reflects neuroelectric oscillations in the alpha-band, rather than any residual hemodynamic effects, physiological noise, or $B_0/B_1$ inhomogeneities.

Importantly, the NEMO protocol/technique can be readily extended to image neuroelectric oscillations in other frequency bands by setting the spin-lock frequency accordingly.

The spin-lock frequency can be shifted within a respective brain wave frequency band (i.e., to increase, decrease within one of the five brain wave activity bands noted above) and/or may be shifted to reside in a plurality of different brain wave frequency bands during a single scan session for a particular subject.

Future experimental paradigms can also be designed to control the phase of the neuroelectric oscillations relative to the spin-lock pulse, such that their temporal evolution can be explicitly investigated. In cases where it is not feasible to control this phase, other analysis methods, such as rectifying the data (i.e., subtracting the mean and taking the absolute value) before computing the FT, may be used to mitigate signal cancellation. The current study used a controlled breathing paradigm (breath hold) to minimize the impact of breathing-induced $B_0$ fluctuations. However, other methodologies may be used. For example, a $B_0$-insensitive spin-lock preparation (see, Witschey II, W. R. T. et al. Artifacts in T1p-weighted imaging: compensation for $B_1$ and $B_0$ field imperfections. *J. Magn. Reson.* 186, 75-85 (2007)), dynamic shimming, or low-field imaging, can be used to reduce or eliminate the sensitivity of this technique to $B_0$ fluctuations, allowing the use of free-breathing paradigms.

Phantom experiments were performed on a 3T MR750 MRI scanner (GE Healthcare, Milwaukee, Wis.) with an 8-channel phased-array head coil. A 3-cm axial wire loop taped outside a 10-cm spherical water phantom was connected through a twisted-pair cable and a variable resistor to a sine-wave function generator (Hewlett-Packard 33120A, Palo Alto, Calif.), which was triggered by the scanner to allow control of the phase of the oscillating current relative to the timing of the spin-lock pulse.

Images were acquired with the spin-lock technique in an axial slice 1 cm away from the loop with echo time=3 ms, field-of-view=12×12 cm, matrix size=64×64, slice thickness=8 mm, spin-lock frequency=10 Hz (corresponding to an amplitude of 235 nT), and spin-lock duration=125 ms (corresponding to a 1 and ¼ turn of the magnetization around the y-axis, as illustrated in FIG. 1D). The NEMO technique can be sensitive to the phase of the oscillating current relative to the spin-lock pulse. In the experiments, a repetition time of 1.0125 s was chosen, so that this phase systematically varied across different time points within each run.

To determine the specificity of the NEMO technique, the oscillating-current amplitude was set to 2.5 mA while its frequency was varied from 4 to 17 Hz at every 15 time points within a single run. To determine the sensitivity of the technique, the oscillating-current frequency was set to 10 Hz while its amplitude was varied from 0 to 0.05 mA (corresponding to a magnetic field at the center of the slice ranging from 0 to 1.2 nT) at every 15 time points within a single run.

The signal intensity was averaged in a 9×9 pixel region-of-interest at the center of the loop and a sinusoidal function was fit to the 15 time points corresponding to each oscillating-current frequency and amplitude (FIG. 2C). The amplitude of this sinusoid was then plotted as a function of the current frequency to generate a response function (FIG. 2A) or as a function of the current amplitude (FIG. 2B). A one-tailed paired t-test was performed between the amplitude of the sinusoid at 0 mA and the amplitude of the sinusoid at every other current amplitude to determine the smallest magnetic field detectable.

Four healthy adult human volunteers were each studied in two repeated sessions on the 3T MRI scanner with a 32-channel phased-array head coil (Nova Medical, Wilmington, Mass.). All subjects provided written informed consent to participate in this study under a protocol approved by the Duke University Health System Institutional Review Board. Foam padding was used to restrain the head within the coil and high-order shimming of the visual cortex was performed to reduce the $B_0$ inhomogeneity in that region to a few Hz.

$T_1$-weighted anatomical images were first acquired with a 3D inversion-prepared spoiled gradient-echo sequence and with repetition time=7.7 ms, echo time=3 ms, inversion time=450 ms, flip angle=12°, field-of-view=24×24 cm, matrix size=256×256, slice thickness=2 mm, and acceleration factor=1.83. The fMRI data were then acquired in a single slice along the calcarine fissure, with repetition time=500 ms, echo time=3 ms (for the NEMO and control runs) or 30 ms (for the BOLD runs), field-of-view=24×24 cm, matrix size=64×64, and slice thickness=8 mm. For the NEMO and control runs, the spin-lock duration was set to 125 ms, as used in the phantom experiments.

The subjects were shown a fixation cross at the center of a black screen through a projector and used both visual cues (a color change of the cross every 2 s) and auditory cues (from the scanner sounds) to determine when to open or close their eyes and when to breathe or hold their breath. All subjects practiced the task before the MRI scans. The NEMO, control-1, control-2, and BOLD runs were interleaved within each session. Each run was 64 s long and started with an additional 8 s of dummy scans to allow for the MR signal to reach a steady state and for the subjects to synchronize their breathing with the paradigm. In addition, the subjects' breathing time course was recorded with a respiratory belt (Biopac Systems, Inc., Goleta, Calif.) wrapped around their chest.

To reduce the impact of breathing-induced $B_0$ fluctuations on the fMRI time courses, all of the 2-second periods during which the subjects were breathing in and out were discarded from both the breathing and fMRI time courses, leaving only the 2-second periods during which the subjects were holding their breath. Furthermore, even though the controlled breathing frequency (0.25 Hz) was specifically chosen to be higher than the eyes open/closed task frequency (0.125 Hz), slight differences in the breathing pattern between the eyes open and eyes closed conditions, resulting in B0 fluctuations at 0.125 Hz, could potentially confound the NEMO activation. Thus, to be sure to fully address this issue, a Fourier transform (FT) was computed along the breathing time course of each run, and any run with a peak at 0.125 Hz in the power spectrum of that time course was excluded from further analysis.

For each of the remaining runs, an FT was computed along the time course of each pixel. Activation maps were generated by extracting the magnitude of the FT at the 0.125-Hz eyes open/closed task frequency (FIGS. 3E-3I). Activated pixels were defined by thresholding these activation maps, using a threshold equal to 1.5 times the mean FT at 0.125 Hz in the posterior third of the brain (to avoid the activation in the frontal area, which resulted from artifacts from the opening/closing of the eyes). These activated pixels were further restricted to the posterior third of the brain (thereby encompassing all pixels in the visual cortex) and to pixels for which there was a peak at 0.125 Hz in the FT (i.e., for which the FT at 0.125 Hz was higher than the FT at both adjacent frequencies). Power spectra were then generated by averaging the magnitude of the FT in these activated pixels for the average of all NEMO runs or all BOLD runs from each subject (FIGS. 4A-4C) and for the average of all NEMO runs or all BOLD runs from all subjects (FIGS. 4D-4F).

Statistical analyses of these activations between conditions were performed in two ways. First, for each subject, one-tailed paired t-tests were performed on the power at 0.125 Hz across all pixels in the posterior third of the brain (thus encompassing all pixels in the visual cortex). Second, one-tailed paired t-tests were performed across the four subjects on the power at 0.125 Hz averaged in all pixels in the posterior third of the brain for each subject. Both types of t-tests compared the average of the NEMO runs from either session or from both sessions vs. the average of either the control-1 or control-2 runs.

In addition, maps of the phase of the FT at 0.125 Hz were computed for each run, restricted to the activated pixels, and overlaid on the anatomical images (FIGS. 5A-5D). Finally, histograms of the phase of the FT at 0.125 Hz were computed in the activated pixels and averaged across all NEMO runs or all BOLD runs from each subject (FIGS. 6A, 6B) and across all NEMO runs or all BOLD runs from all subjects (FIGS. 6C, 6D). For the BOLD runs, the vast majority of the activated pixels had a positive BOLD activation, as expected, and only those were included in the phase maps and histograms. Since the phase of the neuroelectric oscillations relative to the spin-lock pulse varied over time, resulting in a signal increase or decrease, the data were analyzed by using an FT, which allowed a more robust detection of signal changes at the eyes open/closed task frequency than the general linear model traditionally used in BOLD fMRI experiments. Event-related designs and the general linear model may also or alternatively be employed.

To provide additional evidence that the NEMO activation was not confounded by breathing-induced $B_0$ fluctuations between the eyes open and eyes closed conditions, dynamic $B_0$ maps were inherently generated from the fMRI k-space data by using the k-space energy spectrum analysis method, See, e.g., Truong, T. -K., Chen, N. K. & Song, A. W. Application of k-space energy spectrum analysis for inherent and dynamic $B_0$ mapping and deblurring in spiral imaging. *Magn. Reson. Med.* 64, 1121-1127 (2010), which can generate a $B_o$ map at each time point without requiring any additional data acquisition or pulse sequence modification. This dynamic $B_0$ mapping was performed on the BOLD runs, which used the same task paradigm as the NEMO runs, but a longer echo time, resulting in more reliable $B_0$ maps. Again, all of the 2-second periods during which the subjects were breathing in and out were discarded, and any run with a peak at 0.125 Hz in the power spectrum of the breathing time course was excluded from the analysis. An FT was computed along the $B_0$ time course of each pixel, and the power spectrum was averaged in the activated pixels of the NEMO runs (FIG. 7). All data reconstruction and analysis were performed in Matlab (The MathWorks, Natick, NA).

EEG measurements of alpha activity in response to eye-closure were collected on a healthy volunteer, who provided written informed consent to participate in this study under a protocol approved by the Duke University Health System Institutional Review Board. For each trial, the participant was given an auditory cue in the form of a spoken word to close or open their eyes. There were 82 trials, each consisting of a 4-second period during which the eyes were closed. Data were collected on a 64-channel active-electrode Acti-CHamp system (Brain Products GmbH, Germany), using a cap with a custom layout designed for increased coverage of the scalp. Electrodes were prepared until impedances were less than 10 kΩ, and data were recorded at a sampling rate of 500 Hz using the right mastoid location as a reference.

Data analysis was performed using the EEGLAB toolbox (SCCN, Salk Institute, La Jolla, Calif.) in Matlab. For every trial (one alternation of eyes closing and eyes opening), the EEG data were time-locked averaged to the cue to the subject to close their eyes in order to extract the time course of the evoked increase in the magnitude of the alpha activity. For this measurement, the EEG data were re-referenced to the average of the left and right mastoid potentials, and bandpass filtered from 8 to 12 Hz. A Hilbert transform analysis was used to synthesize the analytic complex-valued signal. The continuous data were then segmented into epochs time-locked to the onset of the cue to close the eyes, starting 1000 ms before and extending until 7000 ms after each event. Finally, the magnitude of the complex signal was extracted and time-locked averaged to the onset of the cue to close the eyes, and this resultant average amplitude was base lined relative to a 1000 ms interval prestimulus (FIG. 3J).

Figure 8A:
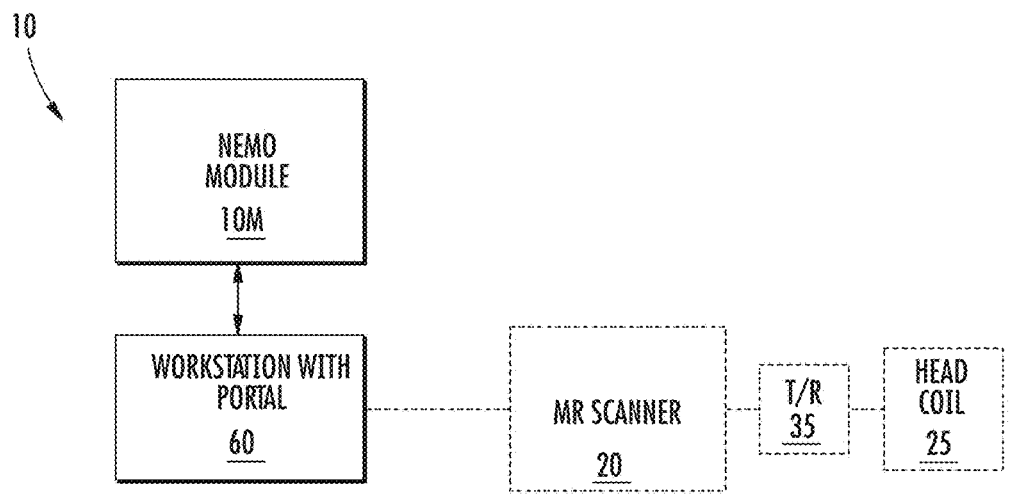
FIGS. 8A-8C are schematic illustrations of different systems that include or communicate with image processing circuits configured to carry out NEMO according to embodiments of the present invention.
Figure 8B:
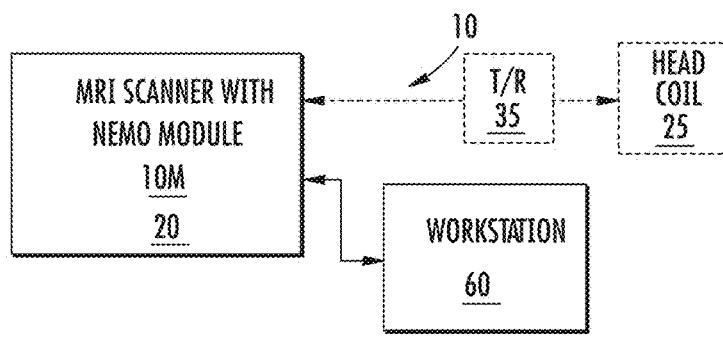
Figure 8C:
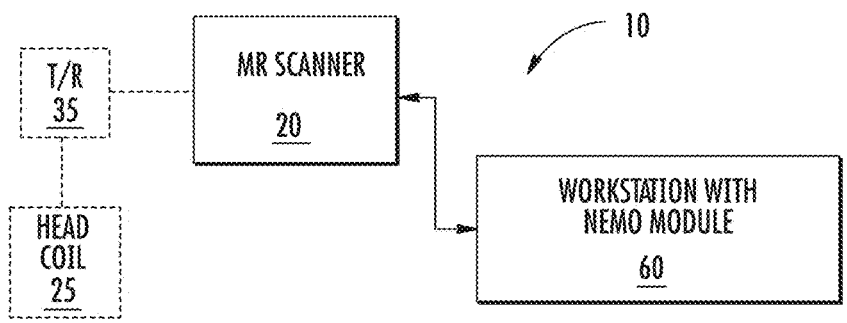

FIGS. 8A-8C illustrate exemplary image processing systems 10 with a NEMO module or circuit 10M.

FIG. 8A illustrates that the system 10 can include at least one workstation 60 that has a portal for accessing the module 10M. The module 10M can be held on a remote server accessible via a LAN, WAN or Internet. The workstation 60 can communicate with the MR Scanner 20 and head coil 25. The MR Scanner 20 typically directs the operation of the pulse sequence and image acquisition using the head coil 25 and at least on transmit/receive switch 35 as is well known to those of skill in the art. The head coil 25 can be a 16 channel array, a 32 channel array, a 64 channel array or even larger number channel array. The head coil 25 may extend to cover the frontal lobe and/or have a helmet configuration, for example. Other head coils may be appropriate. The workstation 60 can include a display with a GUI (graphic user input) and the access portal. The workstation 60 can access the module 10M via a relatively broadband high speed connection using, for example, a LAN or may be remote and/or may have lesser bandwidth and/or speed, and for example, may access the data sets via a WAN and/or the Internet. Firewalls may be provided as appropriate for security.

FIG. 8B illustrates that the module 10M can be partially or totally included in the MR Scanner 20 which can communicate with a workstation 60. The module 10M can be integrated into the control cabinet of the MR Scanner with image processing circuitry.

FIG. 8C illustrates that the module 10M can be integrated into one or more local or remote workstations 60 that communicates with the MR Scanner 20. Although not shown, parts of the module 10M can be held on both the Scanner 20 and one or more workstations 60, which can be remote or local.

Some or all of the NEMO module 10M can be held on at least one server that can communicate with one or more Scanners 20. The at least one server can be provided using cloud computing which includes the provision of computational resources on demand via a computer network. The resources can be embodied as various infrastructure services (e.g., compute, storage, etc.) as well as applications, databases, file services, email, etc. In the traditional model of computing, both data and software are typically fully contained on the user's computer; in cloud computing, the user's computer may contain little software or data (perhaps an operating system and/or web browser), and may serve as little more than a display terminal for processes occurring on a network of external computers. Cloud storage may include a model of networked computer data storage where data is stored on multiple virtual servers, rather than being hosted on one or more dedicated servers. Firewalls and suitable security protocols can be followed to exchange and/or analyze patient data.

Figure 9:
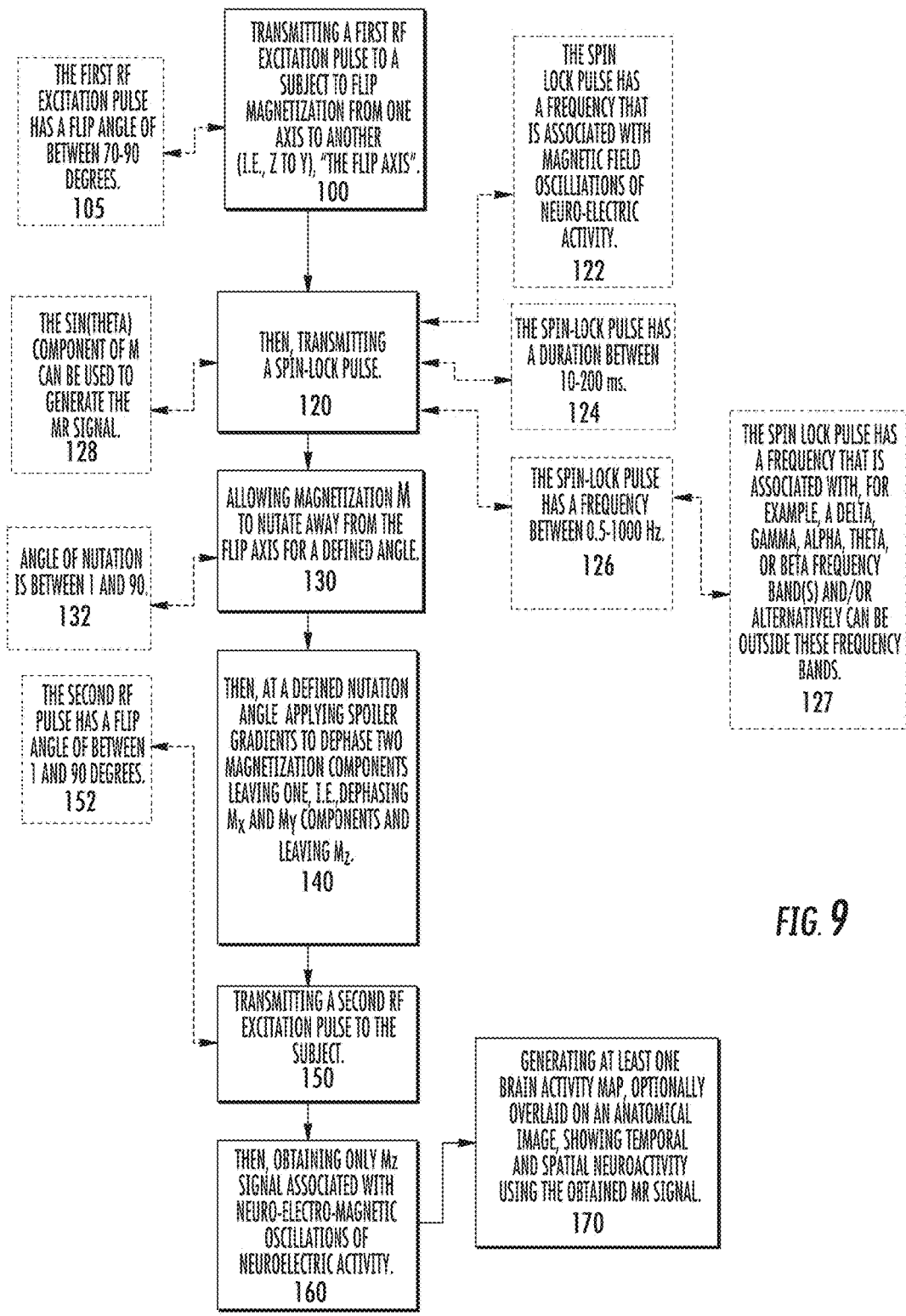
FIG. 9 is a flow chart of exemplary actions that can be performed to generate MRI-derived NEMO images according to embodiments of the present invention.

FIG. 9 is a flow chart of exemplary actions that can be used to generate a NEMO derived image. A first RF excitation pulse can be transmitted to a subject to flip magnetization from one axis to another axis which is a flip axis (i.e., "Z" to "Y") (block 100). A spin-lock pulse can then be transmitted (block 120). Magnetization can nutate away from the flip axis for a defined angle (block 130). Then, at a defined nutation angle, spoiler gradients are applied to dephase two different directional magnetization components, leaving one directional magnetization component, i.e., dephasing Mx and My, leaving Mz (block 140). A second RF excitation pulse is then transmitted (block 150) to image the Mz signal, alone (block 160). The Mz signal is associated with neuro-electro-magnetic oscillations of neuroelectric activity in the brain. Then a brain activity map can be generated showing temporal and spatial neuroactivity using the obtained MR signal (block 170), optionally overlaid on an MRI anatomical image of the brain.

The first RF excitation pulse can have a flip angle of between 70-90 degrees (block 105).

The spin-lock pulse has a frequency that is associated with a frequency/frequency band of magnetic field oscillations of neuroelectric activity of an evoked or spontaneous nature (block 122).

The spin-lock pulse can have a duration of between 10-200 ms (block 124).

The spin-lock pulse can have a frequency in a range of 0.5 Hz to 1000 Hz, and may, for example, be in one of the five brain wave frequency bands, i.e., delta, theta, alpha, beta and gamma brain wave frequency bands (block 126). The spin-lock pulse frequency may also be outside these five frequency bands. The upper limit for the frequency of the spin-lock pulse may also be greater than 1000 Hz.

The pulse sequence can be carried out to shift the spin lock to different brain activity bands and/or different frequencies in an activity band during a scan session of a particular subject.

The frequency f of the spin-lock pulse can be in a brain alpha a activity range: $7.5\ Hz \leq f \leq 14\ Hz$. The frequency of the spin-lock pulse can be in a brain delta $\Delta$ activity range: $0.5\ Hz \leq f \leq 4\ Hz$. The frequency of the spin-lock pulse can be in a brain theta $\theta$ activity range: $4\ Hz \leq f \leq 7.5\ Hz$. The frequency of the spin-lock pulse can be in a brain beta $\beta$ activity range: $14\ Hz \leq f \leq 40\ Hz$. The frequency of the spin-lock pulse can be in a brain gamma y activity range: $f > 40\ Hz$. These ranges are exemplary only and different activity bands may have different upper and lower values, for example.

The $\sin(\theta)$ (also described as "sin(theta)") component of M can be used to generate the MR signal (block 128).

The angle of nutation can be in a range of 1 and 90 degrees, inclusive of each value (block 132).

The second RF pulse can be any suitable value typically between 1 and 90 degree flip angles, inclusive of each end value (block 152).

Different readout protocols can be used for obtaining the image signal. For example, a readout for the electronically obtaining the MR signal can be a 2D imaging readout or a 3D imaging readout, a gradient-echo imaging readout, a spin-echo imaging readout, a spiral imaging readout, or an echo-planar imaging readout.

Figure 10:
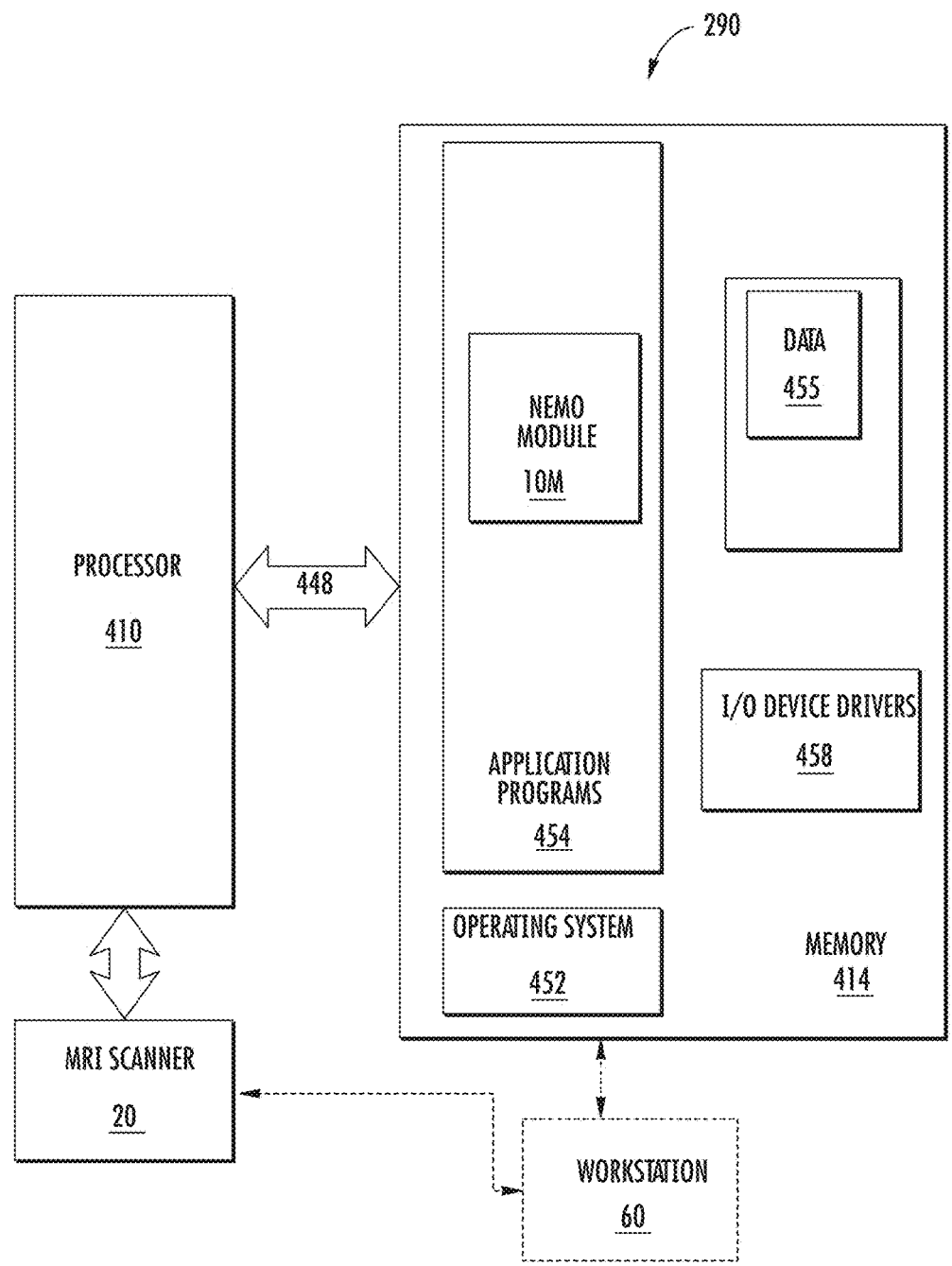
FIG. 10 is a schematic illustration of a data processing system according to embodiments of the present invention.

FIG. 10 is a schematic illustration of a circuit or data processing system 290. The system 290 can be used with any of the systems 10 and provide all or part of the module 10M. The circuits and/or data processing systems 290 data processing systems may be incorporated in a digital signal processor in any suitable device or devices. As shown in FIG. 10, the processor 410 can communicate with an MRI scanner 20 and with memory 414 via an address/data bus 448. The processor 410 can be any commercially available or custom microprocessor. The memory 414 is representative of the overall hierarchy of memory devices containing the software and data used to implement the functionality of the data processing system. The memory 414 can include, but is not limited to, the following types of devices: cache, ROM, PROM, EPROM, EEPROM, flash memory, SRAM, and DRAM.

FIG. 10 illustrates that the memory 414 may include several categories of software and data used in the data processing system: the operating system 452; the application programs 454; the input/output (I/O) device drivers 458; and data 455. The data 455 can include 2-D and/or 3-D k-t space data patient-specific MRI image data.

FIG. 10 also illustrates the application programs 454 can include a NEMO Module 10M.

The data processing system may be particularly suitable for imaging of the human brain.

As will be appreciated by those of skill in the art, the operating systems 452 may be any operating system suitable for use with a data processing system, such as OS/2, AIX, DOS, OS/390 or System390 from International Business Machines Corporation, Armonk, N.Y., Windows CE, Windows NT, Windows95, Windows98, Windows2000, WindowsXP or other Windows versions from Microsoft Corporation, Redmond, Wash., Unix or Linux or FreeBSD, Palm OS from Palm, Inc., Mac OS from Apple Computer, LabView, or proprietary operating systems. The I/O device drivers 458 typically include software routines accessed through the operating system 452 by the application programs 454 to communicate with devices such as I/O data port(s), data storage 455 and certain memory 414 components. The application programs 454 are illustrative of the programs that implement the various features of the data (image) processing system and can include at least one application, which supports operations according to embodiments of the present invention. Finally, the data 455 represents the static and dynamic data used by the application programs 454, the operating system 452, the I/O device drivers 458, and other software programs that may reside in the memory 414.

While the present invention is illustrated, for example, with reference to the Module 10M being an application program in FIG. 10, as will be appreciated by those of skill in the art, other configurations may also be utilized while still benefiting from the teachings of the present invention. For example, the Module 10M may also be incorporated into the operating system 452, the I/O device drivers 458 or other such logical division of the data processing system. Thus, the present invention should not be construed as limited to the configuration of FIG. 10 which is intended to encompass any configuration capable of carrying out the operations described herein. Further, Module 10M can communicate with or be incorporated totally or partially in other components, such as an MRI scanner 20, interface/gateway or workstation 60.

The I/O data port can be used to transfer information between the data processing system, the workstation, the MRI scanner, the interface/gateway and another computer system or a network (e.g., the Internet) or to other devices or circuits controlled by the processor. These components may be conventional components such as those used in many conventional data processing systems, which may be configured in accordance with the present invention to operate as described herein.

Taken together, the results evidence that MRI can be used to noninvasively and directly image neuroelectric oscillations in the human brain in vivo, thereby localizing neuronal activity with both a high spatial and temporal specificity, in contrast to BOLD fMRI, EEG/MEG, or any other known current method.

It is anticipated that this new technique can be further optimized to find broad applications in basic and clinical neuroscience, and that it will be transformative in advancing the ability to study the human brain.

Any patents or publications mentioned in this specification are indicative of the levels of those skilled in the art to which the invention pertains. These patents and publications are herein incorporated by reference to the same extent as if each individual publication was specifically and individually indicated to be incorporated by reference at the location noted by the citation referencing the document. In case of conflict, the present specification, including definitions, will control.

The foregoing is illustrative of the present invention and is not to be construed as limiting thereof Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed:

1. A method of non-invasively imaging neuro-electromagnetic oscillations (NEMO), comprising:
    electronically transmitting a pulse sequence to a subject, wherein the pulse sequence comprises a first radiofrequency (RF) excitation pulse applied along a first axis followed by a spin-lock pulse applied along a second axis and having a frequency, followed by a second RF excitation pulse; then
    after the second RF excitation pulse, electronically obtaining MR image signal of neuroelectric activity associated with evoked and/or spontaneous neuroelectric oscillations; and
    electronically generating a neuro activation map of the neuroelectric activity based on the obtained MR image signal,
    wherein the electronically transmitting the pulse sequence is carried out so that the spin-lock pulse is turned OFF once a defined nutation angle $\theta$ of signal magnetization (M) is reached, then spoiler gradients are applied to dephase and eliminate Mx and My signal components before the second RF excitation pulse is transmitted and so that only Mz signal is obtained after the second RF excitation pulse for the electronically obtaining the MR image signal.

2. The method of claim 1, wherein the first axis is an x axis and the spin lock pulse is applied along a y-axis as the second axis.

3. The method of claim 1, wherein the first axis is a y-axis and the spin lock pulse is applied along an x-axis as the second axis.

4. The method of claim 1, wherein the frequency of the spin-lock pulse is in a range of 0.5 Hz to 1000 Hz.

5. The method of claim 1, wherein Mz signal depends on a phase of the neuroelectric oscillations and the frequency of the spin-lock pulse corresponds to a frequency in a brain activity frequency band of the neuroelectric oscillations.

6. The method of claim 1, wherein the activation map is a brain activation map having high temporal and spatial accuracy of the neuroelectric activity.

7. The method of claim 1, wherein the obtained MR image signal is generated only by an Mz signal component and excludes Mx and My signal components.

8. The method of claim 1, wherein a sin(theta) component of the magnetization (M) is used to generate the MR signal.

9. The method of claim 1, wherein the spin-lock pulse has a duration in a range of 10 ms to 200 ms.

10. The method of claim 1, wherein the subject is human.

11. The method of claim 1, wherein a readout of the electronically obtaining the MR signal comprises a 2D imaging readout.

12. The method of claim 1, wherein a readout of the electronically obtaining the MR signal comprises a 3D imaging readout.

13. The method of claim 1, wherein a readout of the electronically obtaining the MR signal comprises a gradient-echo imaging readout.

14. The method of claim 1, wherein a readout of the electronically obtaining the MR signal comprises a spin-echo imaging readout.

15. The method of claim 1, wherein a readout of the electronically obtaining the MR signal comprises a spiral imaging readout.

16. The method of claim 1, wherein a readout of the electronically obtaining the MR signal comprises an echo-planar imaging readout.

17. The method of claim 1, wherein the first RF excitation pulse is about a 90 degree excitation pulse.

18. The method of claim 1, wherein the method is carried out by an image processing circuit.

19. An MRI image processing system in communication with and/or at least partially on-board an MRI Scanner, comprising at least one processor configured to carry out the method of claim 1.

20. A data processing system comprising non-transitory computer readable storage medium having computer readable program code embodied in the medium, the computer-readable program code comprising computer readable program code configured to carry out any of the method of claim 1.

21. An MRI system, comprising:
    an MR scanner;

a circuit in communication with or at least partially onboard the MR scanner, the circuit comprising a neuro-electro-magnetic oscillations (NEMO) module; and a head coil in communication with the NEMO module, wherein the circuit and/or MR scanner is configured to electronically transmit a pulse sequence to a subject, wherein the pulse sequence comprises a first radiofrequency (RF) excitation pulse applied along a first axis followed by a spin-lock pulse applied along a second different axis and having a frequency, followed by a second RF excitation pulse, and wherein the circuit obtains MR image signal of neuroelectric activity associated with evoked and/or spontaneous neuroelectric oscillations and generates a neuroactivation map based on the obtained MR image signal, and wherein the pulse sequence is carried out so that the spin-lock pulse is turned OFF once a defined nutation angle θ of signal magnetization (M) is reached, then spoiler gradients are applied to dephase and eliminate Mx and My signal components before the second RF excitation pulse is applied and so that only Mz signal is obtained as the MR image signal after the second RF excitation pulse.

22. The system of claim 21, wherein the first axis is an x axis and the spin lock pulse is applied along a y-axis as the second axis.

23. The system of claim 21, wherein the first axis is a y-axis and the spin lock pulse is applied along an x-axis as the second axis.

24. The system of claim 21, wherein the frequency of the spin-lock pulse is in a range of 0.5 Hz-1000 Hz.

25. The system of claim 21, wherein Mz signal depends on a phase of the neuroelectric oscillations and the frequency of the spin-lock pulse corresponds to a frequency in a brain activity frequency band of the neuroelectric oscillations, and wherein the neuroactivation map is a brain activation map having high temporal and spatial accuracy of the neuroelectric activity.

* * * * *

UNITED STATES PATENT AND TRADEMARK OFFICE
CERTIFICATE OF CORRECTION

PATENT NO. : 10,175,319 B2
APPLICATION NO. : 15/582157
DATED : January 8, 2019
INVENTOR(S) : Truong et al.

Page 1 of 1

It is certified that error appears in the above-identified patent and that said Letters Patent is hereby corrected as shown below:

In the Specification

Column 17, Line 48:
Please correct "$B_o$" to read -- $B_0$ --

In the Claims

Column 21, Line 65, Claim 1:
Please correct "neuro activation" to read -- neuroactivation --

Signed and Sealed this
Thirtieth Day of April, 2019

Andrei Iancu
*Director of the United States Patent and Trademark Office*